(12) United States Patent
Nakamura et al.

(10) Patent No.: US 8,026,779 B2
(45) Date of Patent: Sep. 27, 2011

(54) VIBRATOR, RESONATOR USING THE SAME AND ELECTROMECHANICAL FILTER USING THE SAME

(75) Inventors: Kunihiko Nakamura, Osaka (JP); Michiaki Matsuo, San Jose, CA (US); Yoshito Nakanishi, Osaka (JP); Akinori Hashimura, Portland, OR (US)

(73) Assignee: Panasonic Corporation, Osaka (JP)

( * ) Notice: Subject to any disclaimer, the term of this patent is extended or adjusted under 35 U.S.C. 154(b) by 327 days.

(21) Appl. No.: 12/304,602

(22) PCT Filed: Jun. 14, 2007

(86) PCT No.: PCT/JP2007/062033
§ 371 (c)(1),
(2), (4) Date: Feb. 19, 2009

(87) PCT Pub. No.: WO2007/145290
PCT Pub. Date: Dec. 21, 2007

(65) Prior Publication Data
US 2009/0195330 A1 Aug. 6, 2009

(30) Foreign Application Priority Data
Jun. 14, 2006 (JP) .................. P2006-164382

(51) Int. Cl.
*H03H 9/24* (2006.01)
*H03H 9/46* (2006.01)
*H01L 29/06* (2006.01)

(52) U.S. Cl. .......... 333/186; 333/200; 257/25; 310/309

(58) Field of Classification Search .................. 333/186, 333/200; 257/415, 24, 25; 310/309
See application file for complete search history.

(56) References Cited

U.S. PATENT DOCUMENTS

| 5,550,516 | A | 8/1996 | Burns et al. | |
|---|---|---|---|---|
| 7,061,063 | B2 * | 6/2006 | Kato et al. | 257/417 |
| 7,358,648 | B2 | 4/2008 | Nakamura et al. | |
| 7,579,618 | B2 * | 8/2009 | Adam | 257/25 |

(Continued)

FOREIGN PATENT DOCUMENTS
WO  WO 2006/013741  *  2/2006

(Continued)

OTHER PUBLICATIONS

Lee et al: "Mechanically-Coupled Micromechanical Resonator Arrays for Improved Phase Noise," IEEE Int. Ultrasonics, Ferroelectrics, and Frequency Control 50th Anniv. Joint Conf., Montreal, Canada Aug. 24-27, 2004, pp. 280-286.

(Continued)

*Primary Examiner* — Barbara Summons
(74) *Attorney, Agent, or Firm* — Pearne & Gordon LLP

(57) ABSTRACT

An object is to provide a resonator and a vibrator with a high Q value in which dissipation of vibration energy in vibration of the vibrator is small, and a thickness of a support part of the vibrator of a beam structure is made thicker than a thickness of the vibrator and the support part is formed in axisymmetry with respect to a length direction of a beam. By this configuration, brittleness of the support part is improved and loss of vibration energy from the support part is reduced and also loss of vibration energy resulting from surface roughness of a surface of the vibrator can be reduced, so that a resonator having a high Q value can be provided.

13 Claims, 40 Drawing Sheets

U.S. PATENT DOCUMENTS

| | | | |
|---|---|---|---|
| 7,741,932 B2 * | 6/2010 | Nakamura et al. | 333/186 |
| 7,902,942 B2 * | 3/2011 | Hashimura | 333/186 |
| 2001/0016367 A1 | 8/2001 | Ziegler | |
| 2007/0176701 A1 * | 8/2007 | Nakamura et al. | 331/154 |
| 2007/0188272 A1 * | 8/2007 | Nakamura et al. | 333/198 |

FOREIGN PATENT DOCUMENTS

| | | | |
|---|---|---|---|
| WO | WO 2006/075717 | * | 7/2006 |
| WO | WO 2007/037150 | * | 4/2007 |

OTHER PUBLICATIONS

Bannon, III et al; "High-Q HF Microelectromechanical Filters", IEEE Journal of Solid State Circuits, vol. 35, No. 4, Apr. 2000, pp. 512-526.

Agache et al; "Characterization of Vertical Vibration of Electrostatically Actuated Resonators Using Atomic Force Microscope in Non-Contact Mode", Solid-State Sensors, Actuators and Microsystems, Transducers '05, vol. 2, Jun. 5-9, 2005, p. 2023.

Tixier-Mita et al; "Single Crystal Nano-Resonators at 100 MHz Fabricated by a Simple Batch Process", agnes@fujita.3.iis.u-tokyo.ac.jp, Solid-State Sensors, Actuators and Microsystems, Transducers '05, vol. 2, Jun. 5-9, 2005, p. 1388.

Kim et al; "Silicon-Processed Overhanging Microgripper", Journal of Microelectromechanical Systems, vol. 1, No. 1 Mar. 1992, pp. 31-36.

Hasiguchi et al; "Fabrication of Silicon Quantum Wires Using Separation by Implanted Oxygen Wafer" Jpn. J. Appl. Phys. vol. 33 (1994) pp. L 1649-L 1650 Part. 2, No. 12A, Dec. 1, 1994.

* cited by examiner

3 SILICON OXIDE FILM
4 SILICON SUBSTRATE

LOCOS FORMATION REGION
(FILM IS NOT SHOWN)

PLANE a of {111}

PLANE b of {111}

LOCOS FORMATION REGION
(FILM IS NOT SHOWN)

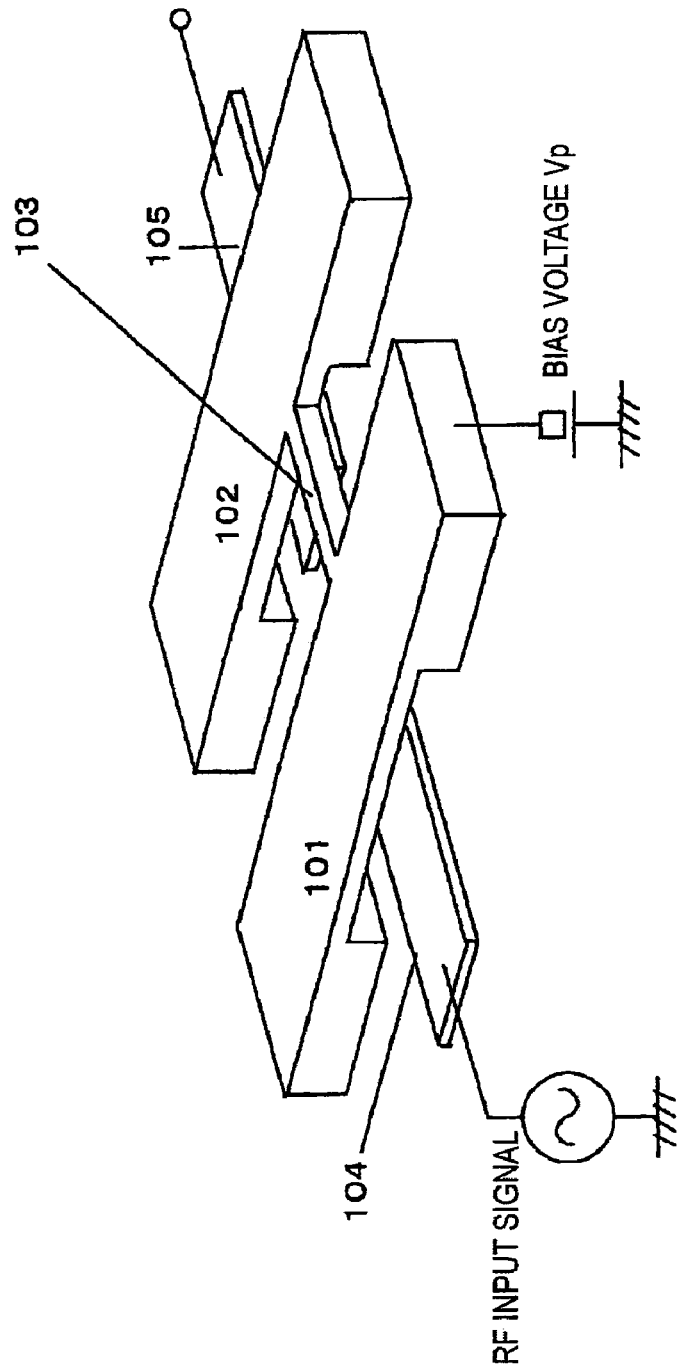

PRIOR ART

PRIOR ART

PRIOR ART

PRIOR ART

VIBRATOR, RESONATOR USING THE SAME AND ELECTROMECHANICAL FILTER USING THE SAME

TECHNICAL FIELD

The present invention relates to a vibrator, a resonator using the same and an electromechanical filter using the same, and particularly to implementation of a high-performance filter circuit inside an electrical circuit integrated at a high density.

BACKGROUND ART

A mechanical resonator using a microfabrication technique has received attention in recent years.

One example of a conventional mechanical resonator will be described with reference to FIG. 33. FIG. 33 is a simplified diagram showing a configuration of a mechanical vibration filter using flexural vibration proposed in Non-patent Reference 1.

This filter is formed by patterning on a silicon substrate using a thin film process, and is constructed of an input rail 104, an output rail 105, straddle mounted beams 101, 102 placed at an air gap of 1 µm or less with respect to the respective rails, and a coupling beam 103 for coupling the two beams. A signal inputted from the input rail 104 is capacitively coupled to the beam 101 and generates electrostatic force in the beam 101. A filtering output of the input signal is constructed so as to be fetched by exciting mechanical vibration only when a frequency of the signal matches with the vicinity of a resonance frequency of an elastic structural body made of the beams 101, 102 and the coupling beam 103 and further detecting this mechanical vibration as a change in capacitance between the output rail 105 and the beam 102.

In the case of being set at an elastic modulus E, a density $\rho$, a thickness h and a length L for a straddle mounted beam with a rectangular cross section, a resonance frequency f of flexural vibration is shown by the following formula.

$$f = 1.03 \frac{h}{L^2} \sqrt{\frac{E}{\rho}} \qquad \text{[Mathematical formula 1]}$$

When a material is set at polysilicon, it becomes E=160 GPa and $\rho$=2.2×10³ kg/m³ and also when dimensions are set at L=40 µm and h=1.5 µm, it becomes f=8.2 MHz and a filter with a band of about 8 MHz can be constructed. Steep frequency selection characteristics with a high Q value can be obtained by using mechanical resonance as compared with a filter constructed of a passive circuit such as a capacitor or a coil.

However, in the construction described above, there are the following restrictions in the case of constructing a filter having a higher frequency band. That is, it is apparent from (mathematical formula 1) that it is first desirable to change a material and increase E/$\rho$, and when E is increased, the amount of displacement becomes small even when force of flexing a beam is equal, and it becomes difficult to detect displacement of the beam.

Also, when an index representing flexibility in a beam is set at a ratio d/L between a length L of the beam and the amount d of flexure of the beam center at the time of applying a static load to a beam surface of a straddle mounted beam, d/L is expressed by a proportional relation of the following formula.

$$\frac{d}{L} \propto \frac{L^3}{h^3} \cdot \frac{1}{E} \qquad \text{[Mathematical formula 2]}$$

From these, in order to increase a resonance frequency while holding a value of d/L, at least E cannot be changed and it is necessary to obtain a material with a low density $\rho$, and it is necessary to use a composite material such as CFRP (Carbon Fiber Reinforced Plastics) as the material with a low density at a Young's modulus equal to that of polysilicon. In this case, it becomes difficult to construct a micromechanical vibration filter in a semiconductor process.

Hence, a second method without using such a composite material includes a method for increasing $h \cdot L^{-2}$ by changing a dimension of a beam in (mathematical formula 1). However, an increase in the thickness h of the beam and a decrease in the length L of the beam result in a decrease in d/L of (mathematical formula 2) which is an index of flexibility and it becomes difficult to detect flexure of the beam.

When a relation between log(L) and log(h) is shown in FIG. 34 with respect to (mathematical formula 1) and (mathematical formula 2), a straight line a has a relation obtained from (mathematical formula 1) and a straight line b has a relation obtained from (mathematical formula 2). In this FIG. 34, in the case of selecting h and L in the range (region A) upper than a straight line with a gradient "2" using a point A of the present dimension as an initial point, f becomes large and in the case of selecting h and L in the range (region B) lower than a straight line with a gradient "1", d/L becomes large. Therefore, the hatch portion (region C) in FIG. 34 is in the range of h and L capable of increasing a resonance frequency while ensuring the amount of flexure of the beam.

It is apparent from FIG. 34 that miniaturization of both dimensions of the length L of the beam and the thickness h of the beam is a necessary condition in a higher frequency of a mechanical vibration filter and miniaturization of L and h at the same scaling, that is, a decrease in L and h while being placed on the straight line with the gradient of 1 is a sufficient condition of the hatch portion of FIG. 34.

By miniaturizing a dimension of a mechanical vibrator in a conventional mechanical resonator thus, a resonance frequency can be increased. However, there was a problem that the case where a mechanical Q value reduces and the Q value necessary to obtain desired frequency selection characteristics cannot be obtained occurs by miniaturizing the dimension generally.

Hence, a resonator using a single-crystal material is contemplated as a resonator with a good Q value. In a vibrator of the single-crystal material, internal atoms are regularly arranged, so that a higher Q value can be obtained as compared with a polycrystalline material. For example, FIG. 35 is a straddle mounted beam structure fabricated by processing an SOI layer of a silicon substrate 204 constructing an SOI (Silicon on Insulator) substrate shown in Non-patent Reference 2. However, in this structure, a beam can be vibrated by removing a BOX (Buried Oxide) layer 203 under the SOI layer using hydrofluoric acid and the BOX layer under a support part 205 is also removed and the support part becomes brittle. Consequently, vibration of the support part 205 becomes nonnegligible and with a decrease in a resonance frequency of a straddle mounted beam, dissipation of vibration energy from the support part occurs, so that it becomes difficult to obtain a large Q value.

Hence, an example of improving brittleness of the support part 205 by thickening a thickness of the support part 205 more sufficiently than a thickness of a vibrator 201 constructing a beam is disclosed in Non-patent Reference 3. FIG. 36 is a structure of the vicinity of a support part 205 of a straddle mounted beam shown in Non-patent Reference 3. A thickness of the support part 205 is a thickness of a silicon substrate 204 and a thickness of the beam is thin sufficiently with respect to the thickness of the silicon substrate and therefore, the support part 205 has a robust structure. However, a structure of the support part is not axisymmetrical with respect to a length direction of the beam, so that the support part 205 becomes brittle as the support part of one side (for example, the side A) with respect to the axis retracts in the length direction of the beam. Since the side A and the side A' of the support part 205 are formed by dry etching and individual lithography of two times, high-accuracy alignment of the lithography of two times is required in order to reduce retraction of one side. It becomes very difficult to perform this alignment step as a dimension of the vibrator becomes fine from the order of µm to the order of nm.

Also, in the method of fabrication of the vibrator of Non-patent Reference 3, it is difficult to approach the vibrator 201 and form an electrode 202. FIG. 37 is a diagram showing cross sections of the substrate and the vibrator of FIG. 36. Since there is an opening part between the substrate and the vibrator as shown in FIG. 37A, in the case of attempting to form the electrode 202 proximate to a side surface of the vibrator 201 by a thin-film formation technique such as sputtering, there is the opening part, so that the electrode cannot be anchored to the substrate or a robust electrode structure cannot be formed because a thickness of the electrode near to the opening part becomes extremely thin as shown in FIG. 37B.

There is also a technique in which boron is diffused from a surface of a silicon substrate and anisotropic etching is performed from a back surface of the silicon substrate and a diffusion layer of the boron is used as an etching stop layer of the anisotropic etching (Non-patent Reference 4). When a diffusion region of boron is formed in a beam shape, a beam type vibrator can also be formed as shown in FIG. 38. An electrode can be formed on the substrate surface since there is no opening part on the substrate surface before the anisotropic etching is performed. However, an effect of an etching stop varies depending on variations in diffusion of boron, so that it was difficult to obtain a beam shape having a predetermined dimension and it was extremely difficult to obtain a desired value with respect to a resonance frequency. Also, a surface of the vibrator is not flat, so that loss of vibration energy resulting from surface roughness occurs and a Q value reduces.

Also, a smaller vibrator must be formed in order to increase a resonance frequency of a resonator to a VHF band or a UHF band. With this, an opposite area of the vibrator and the electrode becomes smaller, so that capacitance becomes small and also an impedance becomes high. In a high-frequency signal, energy loss of an RF signal increases when the extent of an impedance mismatch becomes high. As this solution method, there is a method for reducing an impedance by electrically connecting plural resonators in parallel and approaching a match state. FIG. 39A is a resonator constructed of a vibrator using aluminum as a material. A vibrator 201 has a straddle mounted beam structure and is supported by a support part 205. An electrode 202a for excitation and an electrode 202b for detection are placed on both side surfaces of the vibrator 201 through gaps. In this configuration, the vibrator 201 produces flexural vibration in a direction attracted in a direction of the electrode 202a for excitation and its resonance frequency is 35.5 MHz. FIG. 39B is a configuration of electrically connecting plural resonators of FIG. 39A in parallel and reducing an impedance.

FIG. 40A shows impedances at the time of setting the number N of resonators electrically connected in parallel at 1, 10 and 100. However, the individual resonators are fabricated with extremely high dimension accuracy, so that variations in a resonance frequency become substantially 0. As shown in FIG. 40A, the impedance can be reduced without changing resonance characteristics as the number N is increased.

FIG. 40B shows impedances in the case of having variations (0.3 MHz in a standard deviation) in resonance frequencies of individual resonators. In the case of having the variations, as the number N of resonators is increased to 10 and 100, the peak at the resonance frequency is not sharp and it becomes difficult to construct a good resonator.

The variations in resonance frequencies must be suppressed by processing individual resonators with high accuracy in order to electrically connect plural resonators in parallel for reduction in the impedance thus. In a resonance frequency of a straddle mounted beam, a thickness and a length of the beam become predominant in flexural vibration and a length of the beam becomes predominant in torsional vibration, so that it becomes important to manage the thickness and the length of the beam in the case of using flexural resonance and it becomes important to manage the length of the beam in the case of using torsional resonance.

Non-patent Reference 1: Frank D. Bannon III, John R. Clark, and Clark T.-C. Nguyen, "High-QHF Microelectromechanical Filters", IEEE Journal of Solid-State Circuits, Vol. 35, No. 4, pp. 512-526, April 2000

Non-patent Reference 2: Vincent Agache et. al, "CHARACTERIZATION OF VERTICAL VIBRATION OF ELECTROSTATICALLY ACTUATED RESONATORS USING ATOMIC FORCE MICROSCOPE IN NONCONTACT MODE", Proc. of IEEE TRANSDUCERS '05, pp. 2023-2026

Non-patent Reference 3: A. Tixier-Mita and others, "SINGLE CRYSTAL NANO-RESONATORS AT 100 MHz FABRICATED BY A SIMPLE BATCH PROCESS", Proc. of IEEE TRANSDUCERS '05, pp. 1388-1391

Non-patent Reference 4: Chang-Jin Kim and others, "Silicon-Processed Overhanging Microgripper", Journal of Microelectromechanical Systems, Vol. 1, No. 1, 1992, pp. 31-36

DISCLOSURE OF THE INVENTION

Problems that the Invention is to Solve

While it is extremely difficult to control a thickness or a length of a beam with high accuracy in the conventional resonator thus, it is necessary to use vibrators having dimensions controlled with extremely high accuracy particularly when plural vibrators are connected and used. However, it was extremely difficult to suppress dissipation of vibration energy of the vibrator and reproducibly obtain the vibrator having a high Q value with high accuracy.

The invention has been implemented in view of the actual circumstances described above, and an object of the invention is to provide a resonator and a vibrator with a high Q value in which dissipation of vibration energy in vibration of the vibrator is small.

Means for Solving the Problems

In order to solve the problem described above, in a vibrator of a resonator of the invention, a thickness of a support part of the vibrator of a beam structure is made thicker than a thickness of the vibrator and the support part is formed in axisymmetry with respect to a length direction of a beam.

According to this configuration, brittleness of the support part is improved and loss of vibration energy from the support part can be reduced, so that a resonator having a high Q value can be provided.

Also at the same time, a vibrator is formed by a single-crystal material and a surface of the vibrator is formed in a crystal plane. Consequently, loss of vibration energy resulting from surface roughness of the surface of the vibrator can be reduced, so that the resonator having the high Q value can be provided. When the surface roughness is rough, the number of atoms (a surface layer part of the vibrator) irregularly arranged increases as compared with atoms (a deep layer part of the vibrator) regularly arranged accordingly. Since the atoms of this surface layer part differ from the atoms of the deep layer part in a restricted state of motion, motion of the atoms of the deep layer part vibrating in a state of being harmonized and arranged regularly is inhibited, with the result that it becomes a cause of loss of vibration energy.

That is, a vibrator of the invention is constructed of a cavity formed in a back surface of a single-crystal substrate and a vibrator formed so that at least one end of the vibrator is supported by a support part within a thickness between a front surface of the single-crystal substrate and a bottom surface of the cavity, the single-crystal substrate is a silicon substrate, a cross section shape of the beam type vibrator is a triangular shape or a trapezoidal shape surrounded by crystal planes of $\{100\}$ and $\{111\}$, and a thickness of the vibrator is thinner than that of the support part and the support part is formed in axisymmetry with respect to a length direction of a beam.

Also, a resonator of the invention comprises a single-crystal substrate, a cavity formed in a back surface of the single-crystal substrate and a beam type vibrator formed so that at least one end of the vibrator is supported by a support part within a thickness between a front surface of the single-crystal substrate and a bottom surface of the cavity, and an electrode which applies excitation force of electrostatic force to the beam type vibrator, the single-crystal substrate is a silicon substrate, a cross section shape of the beam type vibrator is a triangular shape or a trapezoidal shape surrounded by crystal planes of $\{100\}$ and $\{111\}$, and a thickness of the vibrator is thinner than that of the support part and the support part is formed so as to be axisymmetrical with respect to a length direction of a beam.

According to the configuration described above, a support part with a film thicker than a thickness of a beam type vibrator can be formed and also the support part can be formed in axisymmetry with respect to a length direction of a beam, so that the support part can be formed in a robust structure. Also, vibration characteristics can be improved while improving support properties. Also, by performing anisotropic etching of a single-crystal substrate, a pattern can be formed with good controllability and at the same time, the vibrator of a single-crystal material can be obtained, so that loss of vibration energy at a crystal grain boundary as seen in a polycrystalline material can also be reduced. Also, all the surfaces of the vibrator are formed in a crystal plane, so that there is also an effect of reducing loss of vibration energy resulting from surface roughness.

Also, in the resonator of the invention, a plurality of the beam type vibrators are formed within the thickness between the front surface of the single-crystal substrate and the bottom surface of the same cavity.

According to this configuration, the plurality of vibrators with the same length can be formed, so that the plurality of resonators having the same resonance frequency can be arranged adjacently. Therefore, by electrically connecting capacitance formed between the electrode and the vibrators in parallel, the capacitance is increased and an electrical impedance is decreased and a match of the electrical impedance with an electrical circuit of the periphery including the resonator can be obtained easily.

Also, in the resonator of the invention, the single-crystal substrate is a silicon substrate.

According to this configuration, a resonator can be manufactured by a semiconductor manufacturing apparatus. Also, the resonator can be integrated on the same silicon substrate by connecting other active element. Or, the resonator can be incorporated into other active element.

Also, in the resonator of the invention, the single-crystal substrate is an SOI layer of an SOI substrate. According to this configuration, a vibrator can be formed of a thin SOI layer with the order of $\mu$m or the order of nm, so that a beam type vibrator having a resonance point at a very small UHF band can be formed.

Also, in the resonator, a cross section shape of the beam type vibrator is a triangular shape or a trapezoidal shape surrounded by crystal planes of $\{100\}$ and $\{111\}$.

In this configuration, a beam type vibrator can formed simply using an etching solution having crystal anisotropy.

Also, in the resonator, the electrode is opposed to the whole area of a width direction of a side surface of the beam type vibrator exposed to a front surface of the single-crystal substrate through an air gap, and a capacity is formed between the beam type vibrator and the electrode.

According to this configuration, a flexural vibration mode of a beam type vibrator can be excited by electrostatic force generated between an electrode and the beam type vibrator.

Also, in the resonator of the invention, conductivity of the vibrator is asymmetrical with respect to a torsional center axis of the longitudinal direction of the beam of the vibrator.

According to this configuration, the plurality of torsional vibrators with the same resonance frequency can be integrated densely and an impedance can be reduced.

Also, in the resonator of the invention, the electrode is opposed to substantially a half area of a width direction of a side surface of the beam type vibrator exposed to a front surface of the single-crystal substrate through an air gap, and a capacity is formed between the beam type vibrator and the electrode.

According to this configuration, a torsional vibration mode of a beam type vibrator can be excited by electrostatic force generated between an electrode and the beam type vibrator. This air gap is set at a value in which a distance between the electrode and the vibrator can generate predetermined electrostatic force, and the opposed electrode may be absent in the other region, and a size of the air gap may be adjusted so that a distance to the vibrator becomes a predetermined value or more and electrostatic force becomes sufficiently smaller than that of the other region.

Also, in the resonator of the invention, the plurality of electrodes in response to a resonance mode order of the beam type vibrator.

According to this configuration, a resonator using a high-order mode resonance frequency as well as a basic mode frequency of vibration can be constructed.

Also, in the resonator of the invention, the electrode is fixed on a thick film part of the single-crystal substrate arranged at a peripheral edge of the cavity through an insulating film.

According to this configuration, a thickness of a substrate site at which the electrode is fixed is sufficiently thicker than a thickness of a beam, so that it is robust and thus the amount of displacement of the electrode itself due to electrostatic force between the electrode and the vibrator or a shock from the outside can be reduced.

Also, in the resonator of the invention, the beam type vibrator is a straddle mounted beam and both ends of its beam are equipped with support parts made of impurity diffusion regions of a conduction type opposite to that of the beam type vibrator, and an amplifier in which the beam type vibrator is used as a channel and the support parts made of the impurity diffusion regions are used as a source region and a drain region is constructed.

According to this configuration, a resonance phenomenon of a vibrator can be electrically outputted through an amplifier and also a resonator is included inside the amplifier, so that noise superposed on a signal rail in the case of disposing the signal rail between the resonator and the amplifier can be reduced.

Also, the resonator of the invention includes a plurality of resonators electrically arranged in parallel.

According to this configuration, an electrical impedance of a resonator can further be reduced and also high dimension accuracy can be obtained, so that characteristic variations are suppressed and a resonator with extremely high reliability can be obtained.

Also, in the resonator of the invention, the vibrator is accommodated inside a case in which the atmosphere is sealed in a vacuum.

According to this configuration, a resonator with a high Q value in which vibration of a vibrator is not inhibited by viscosity of air while improving protection of the resonator can be provided.

Also, a filter of the invention includes a filter equipped with the resonator described above.

Advantage of the Invention

According to a configuration of a resonator of the invention, a filter with a high Q value capable of being used at a UHF band can be provided.

BRIEF DESCRIPTION OF THE DRAWINGS

FIG. 33 is a schematic diagram showing a filter using a conventional mechanical resonator.

DESCRIPTION OF REFERENCE NUMERALS AND SIGNS

Figure 1:
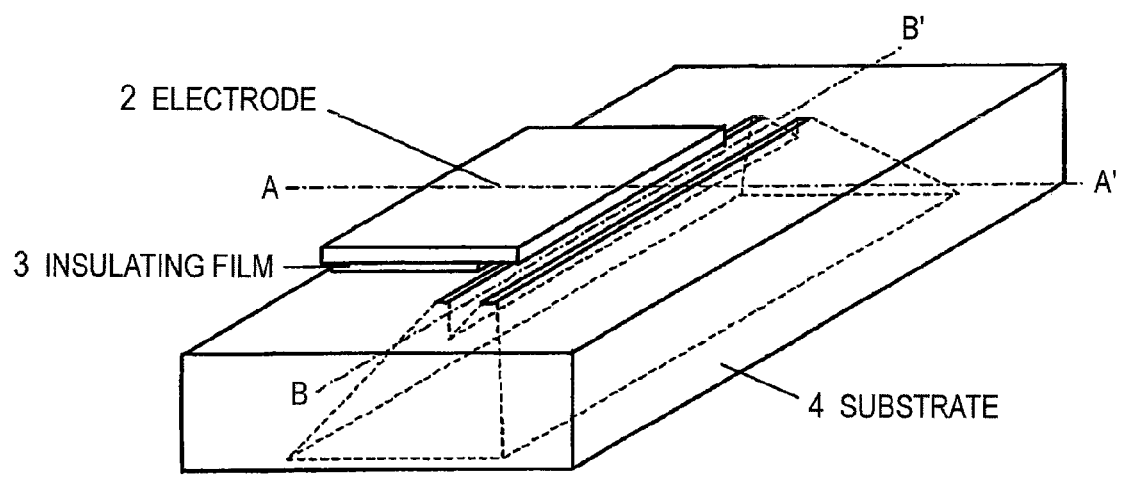
FIG. 1 is a perspective view of a torsional resonator in a first embodiment of the invention.

1 Vibrator
2 Electrode
3 Insulating film
4 Substrate
5 Support part
6 Gap
7 Cavity
101, 102 Straddle mounted beam type vibrator
103 Coupling beam
104 Input rail
105 Output rail

BEST MODE FOR CARRYING OUT THE INVENTION

Embodiments of the invention will hereinafter be described in detail with reference to the drawings.

First Embodiment

In the present embodiment, in the case of forming a vibrator 1 while forming a cavity 7 by anisotropic etching of a single-crystal silicon substrate 4, the vibrator 1 is formed so as to support both ends by support parts 5 within a thickness between a front surface of the single-crystal silicon substrate 4 and a bottom surface of the cavity 7 and a thickness of the vibrator 1 is constructed so as to become thinner than that of the support part.

Figure 2:
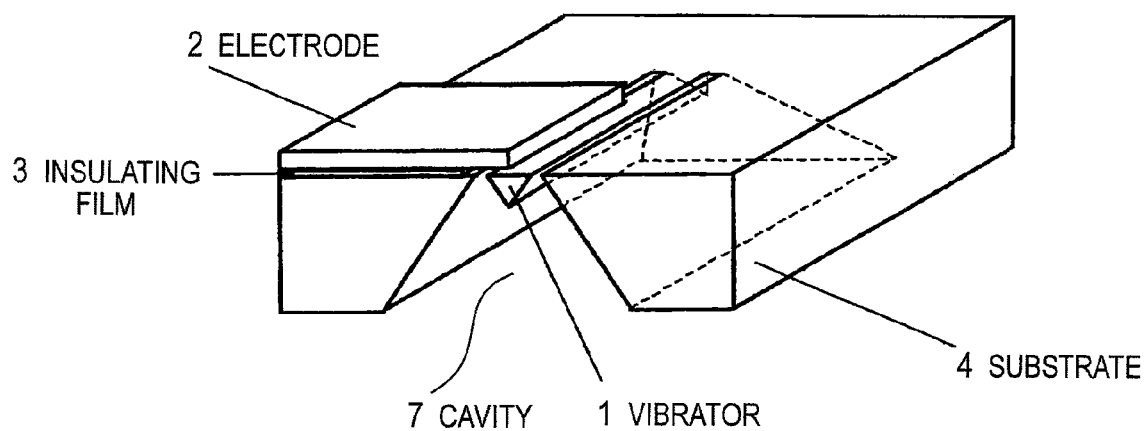
FIG. 2 is a cross sectional view of the torsional resonator in the first embodiment of the invention.
Figure 3:
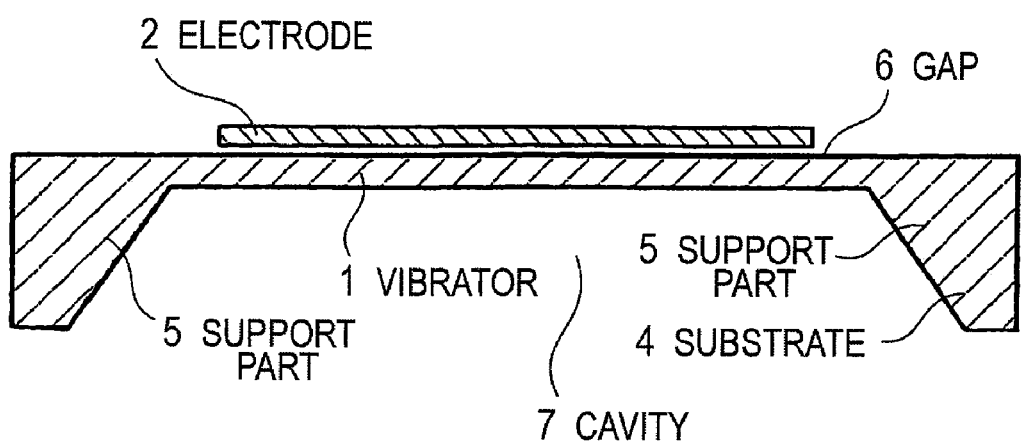
FIG. 3 is a cross sectional view of the torsional resonator in the first embodiment of the invention.

FIG. 1 is a main perspective view of a resonator in a first embodiment of the invention. FIG. 2 is a cross sectional view in a vertical direction of A-A' of FIG. 1, and FIG. 3 is a cross sectional view in a vertical direction of B-B' of FIG. 1. The resonator of the first embodiment has a beam type vibrator 1 for producing torsional vibration and an electrode 2 placed in proximity to a side surface of the beam type vibrator 1 through a gap 6.

Here, the cavity 7 is formed in a back surface of the single-crystal silicon substrate 4 and the vibrator 1 is processed over the cavity by the same material as that of the substrate 4. Since the vibrator is formed by processing of the single-crystal silicon substrate, the support part and the vibrator are constructed of the same single-crystal material and there is no loss of vibration energy at a crystal grain boundary surface as seen in a vibrator of a polycrystalline material, so that the vibrator having a high Q value can be formed.

Figure 36:
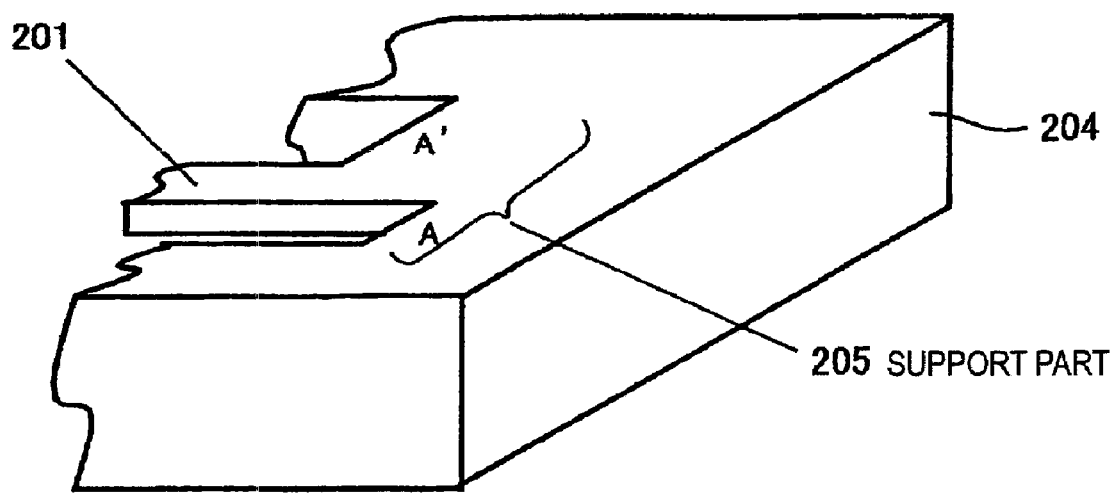
FIG. 36 is an explanatory diagram of a support part of a conventional mechanical resonator using a silicon substrate.
Figure 37A:
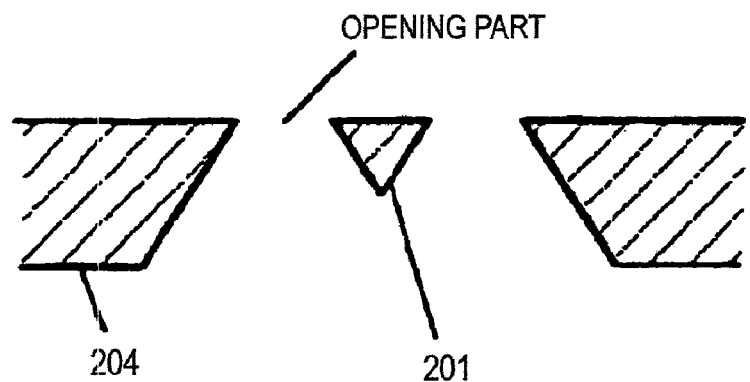
FIGS. 37A and 37B are diagrams showing a state of forming an electrode in the conventional mechanical resonator using the silicon substrate.
Figure 37B:
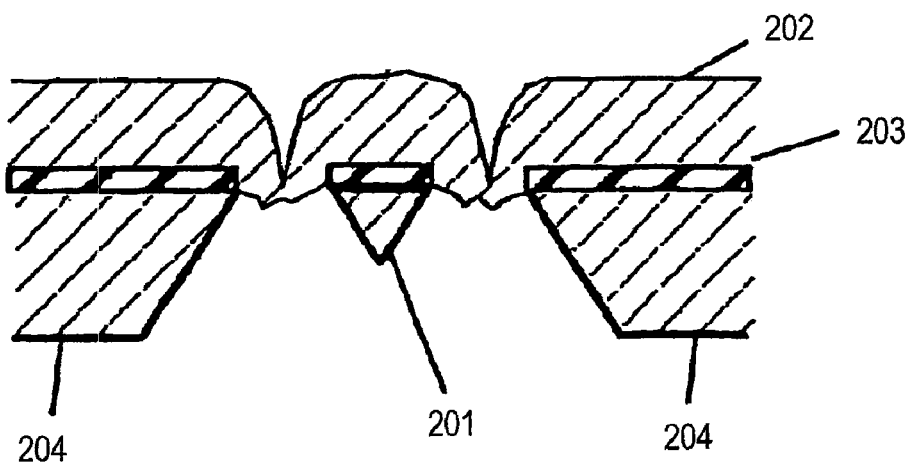
Figure 38:
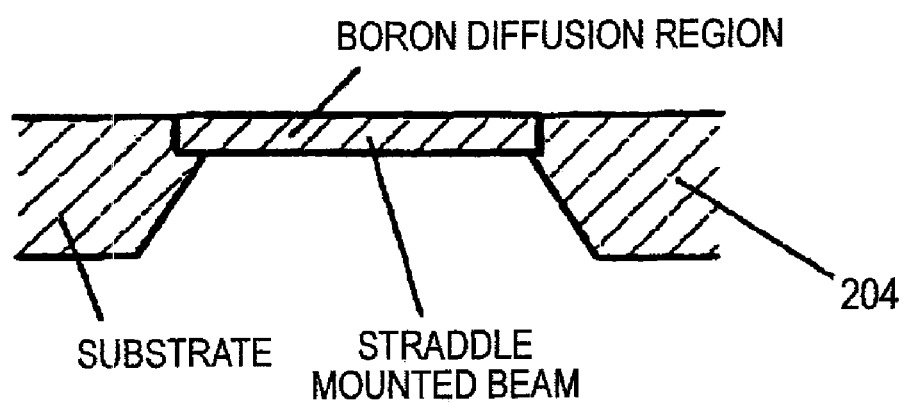
FIG. 38 is an explanatory diagram of a method of fabrication of a conventional vibrator in which an etch stop of a boron diffusion region is made.
Figure 39A:
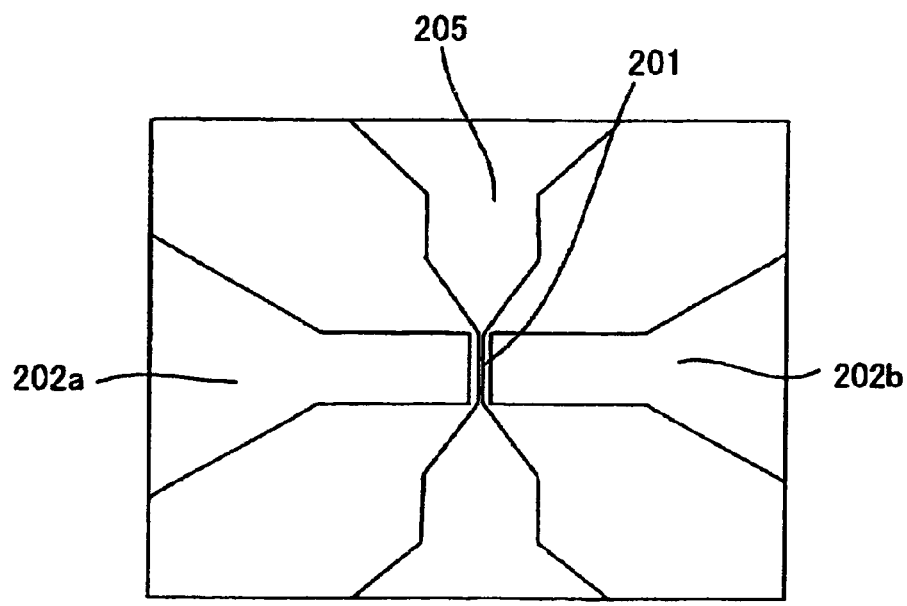
FIG. 39A is a diagram showing an example of a resonator single body fabricated by aluminum.
Figure 39B:
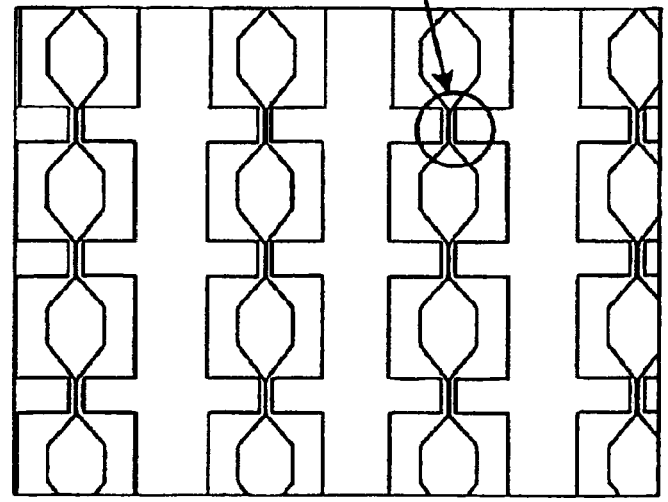
FIG. 39B is a diagram showing a configuration of electrically connecting plural resonators in parallel.
Figure 40A:
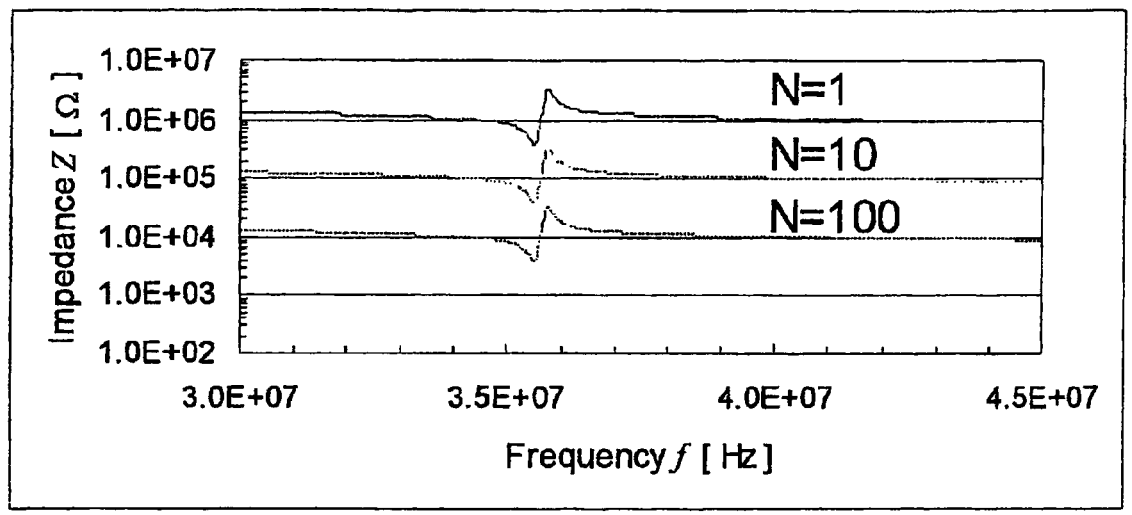
FIG. 40A is a diagram showing a relation between an impedance and the number of parallel connections in the case where there are no variations in a resonance frequency.
Figure 40B:
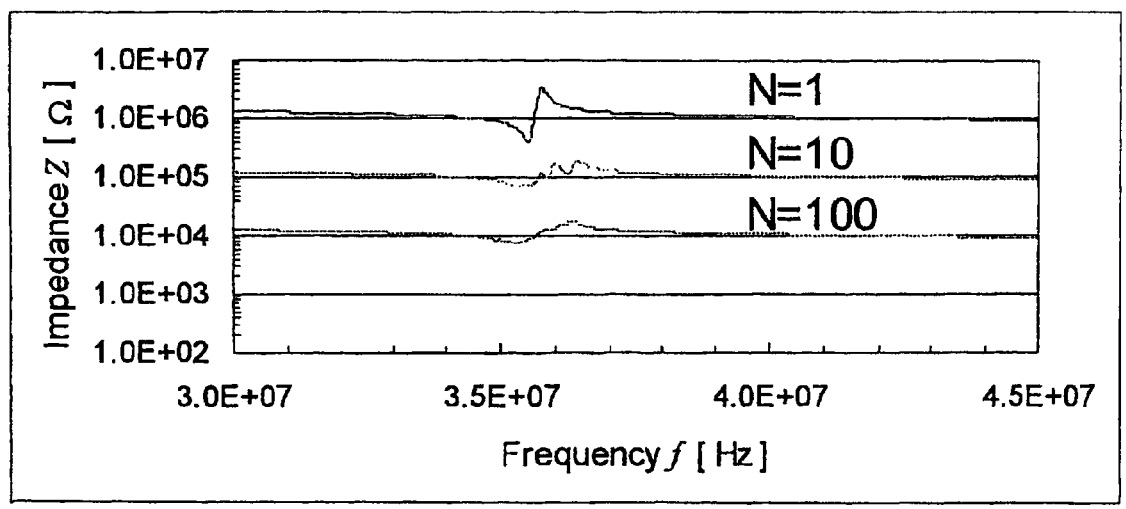
FIG. 40B is a diagram showing a relation between an impedance and the number of parallel connections in the case where there are variations in a resonance frequency.

Both ends of the vibrator 1 are fixed to the support parts 5. A thickness of the support part 5 is equal to a thickness of the substrate 4 and is thicker than a thickness of the vibrator 1. Therefore, as compared with the case where the thickness of the support part is equal to the thickness of the vibrator, the support part becomes robust and even when the vibrator 1 vibrates, the support part is resistant to being vibrated and an effect of suppressing the amount in which vibration of the vibrator 1 leaks to the support part and vibration energy dissipates is obtained. Also, since the vicinities of connection between the vibrator 1 and the support parts 5 are symmetrical with respect to the axis of B-B' of a length direction of the vibrator 1, one side of the support part 205 does not retract in the length direction of the beam as shown in FIG. 36 of the conventional example, so that the support part has a more robust structure.

The electrode 2 is formed by a polycrystalline silicon film. As shown in FIG. 2, the electrode 2 is opposed to about a half area of a width direction of a side surface of the beam type vibrator 1 through a gap 6, and a capacity is constructed between the beam type vibrator 1 and the electrode 2. This is because electrostatic force effectively provides the torsional rotation moment when the electrostatic force is applied to a gap between the opposed surfaces and the vibrator produces vibration.

Next, a manufacturing method of the resonator in the first embodiment of the invention will be described using FIGS. 4 to 13. In FIGS. 4 to 13, A is a diagram in the case of viewing a main part from the above of a substrate and B is a cross sectional diagram of C-C' of A (C-C' is omitted in FIGS. 5 to 13). The substrate 4 is a single-crystal silicon substrate, and a front surface and a back surface of the substrate are a plane of {100} and a surface viewed in a cross section is a plane of {110}. A silicon oxide film is formed on the front surface (lower side in the drawings) of the substrate. A silicon nitride film is formed on the back surface of the substrate and a quadrilateral window is formed in this silicon nitride film. Four sides of this window are formed along a plane of {111}.

Figure 5A:
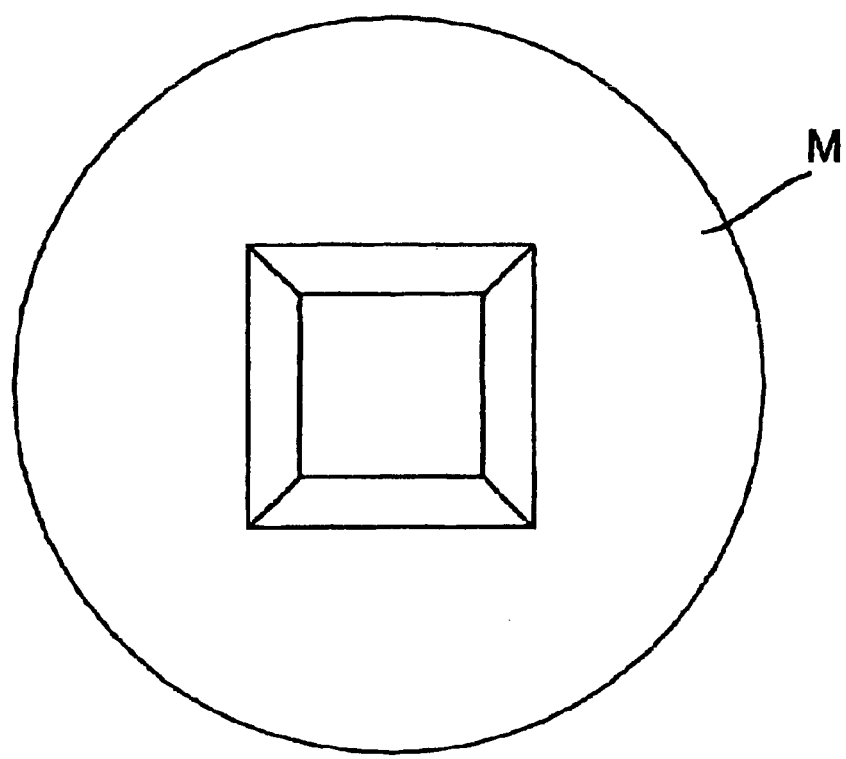
FIGS. 5A and 5B are explanatory diagrams showing a manufacturing method of the torsional resonator in the first embodiment of the invention.
Figure 5B:
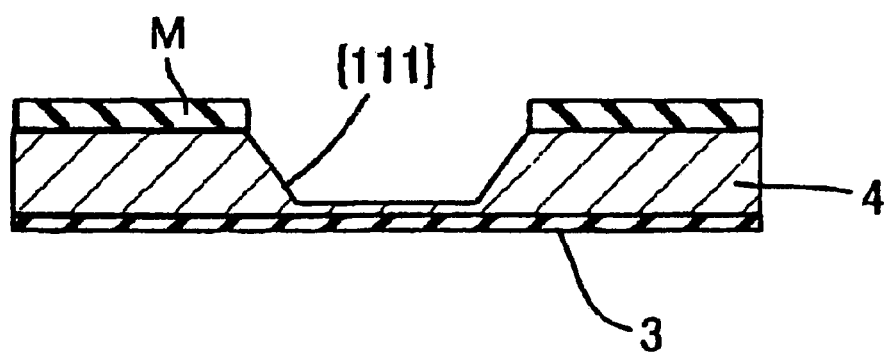
Figure 6A:
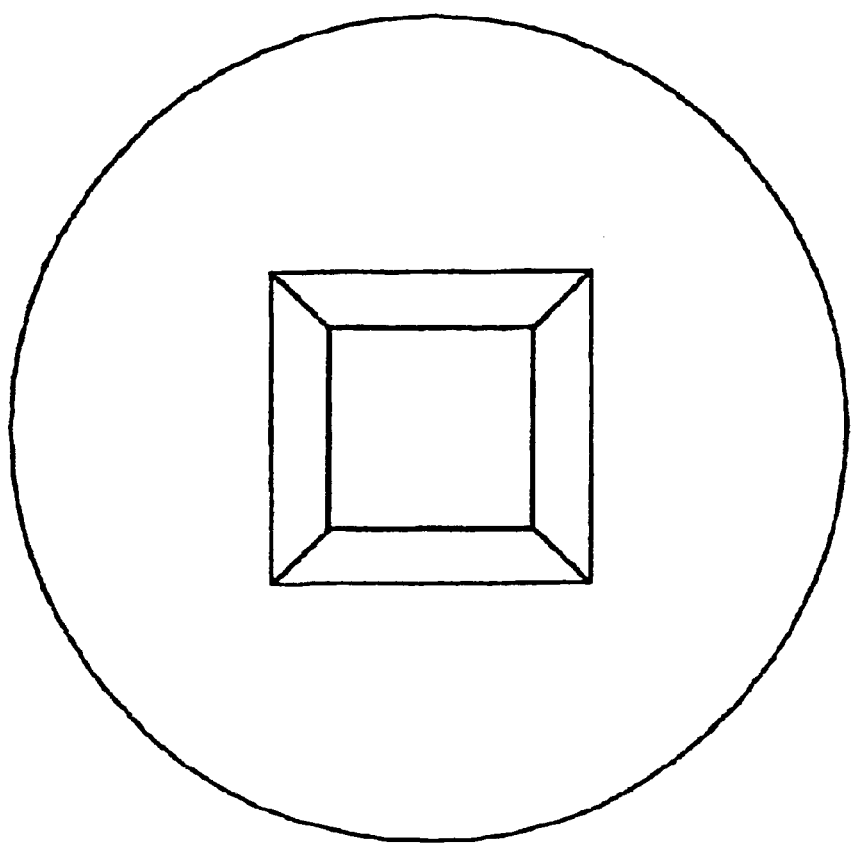
FIGS. 6A and 6B are explanatory diagrams showing a manufacturing method of the torsional resonator in the first embodiment of the invention.
Figure 6B:
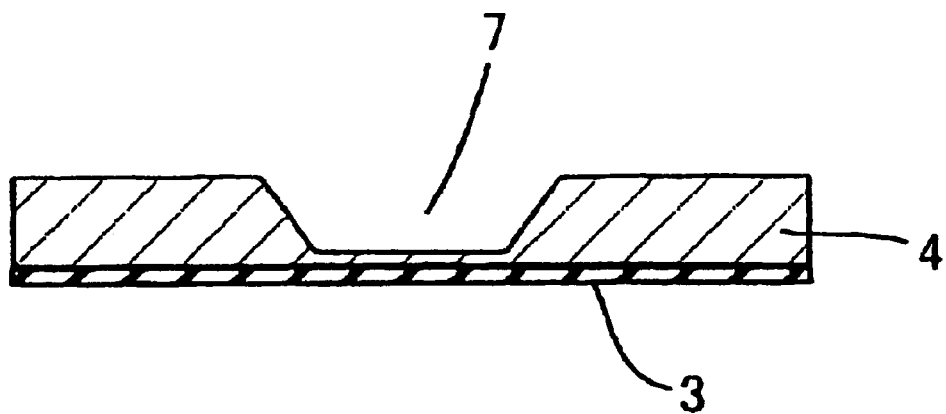

Anisotropic etching of silicon is performed from the back surface of the substrate 4 using KOH. An etching rate of the plane of {111} is lower than those of the other planes, with the result that the etching proceeds so as to expose the plane of {111} as shown in FIGS. 5A and 5B. {100} and {111} have a position relation of 54.7°. The etching is stopped within the time when a bottom surface of the cavity 7 does not reach the front surface of the substrate. When the silicon nitride film is removed, a state of FIGS. 6A and 6B is obtained.

Figure 7A:
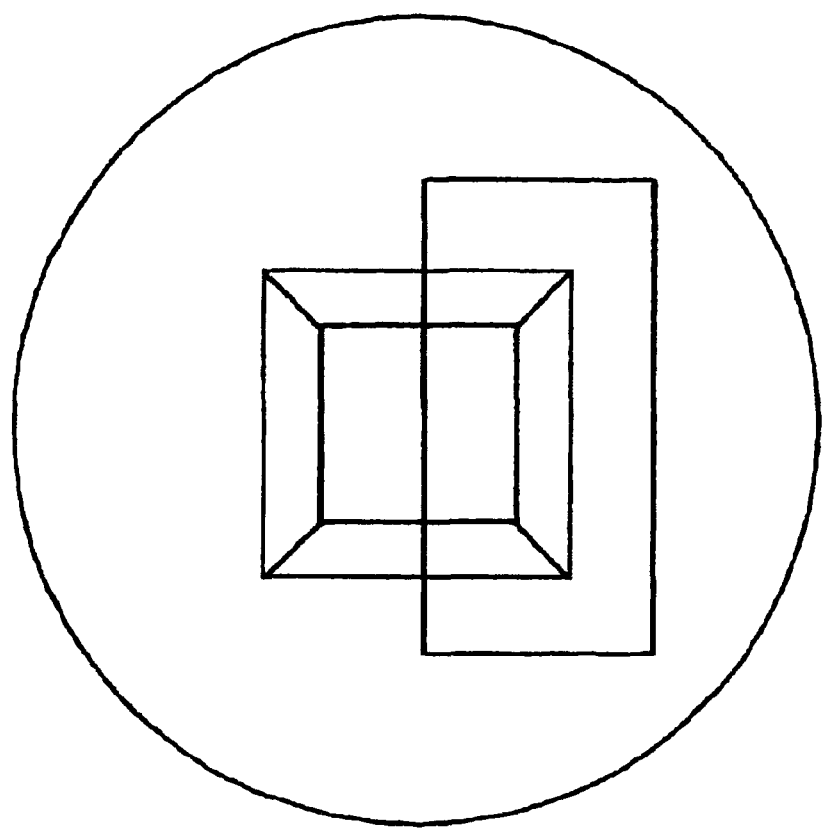
FIGS. 7A and 7B are explanatory diagrams showing a manufacturing method of the torsional resonator in the first embodiment of the invention.
Figure 7B:
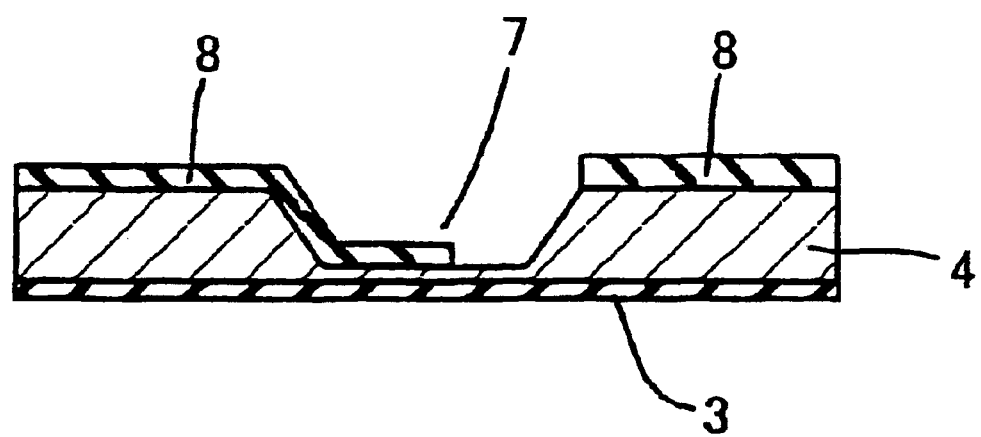

Next, it proceeds to a fabrication step of a beam type vibrator. A processing technique by anisotropic etching is also used in fabrication of a beam structure. This is introduced in Non-patent Reference 5, and partially utilizes a method also used in generation of a quantum wire. In FIGS. 7A and 7B, a silicon nitride film 8 is again deposited on the back surface of the substrate 4 and a quadrilateral window is formed in the silicon nitride film 8. At this time, one side of the window traverses the cavity 7 and is formed along a plane of {111} as shown in FIGS. 7A and 7B.

Figure 8A:
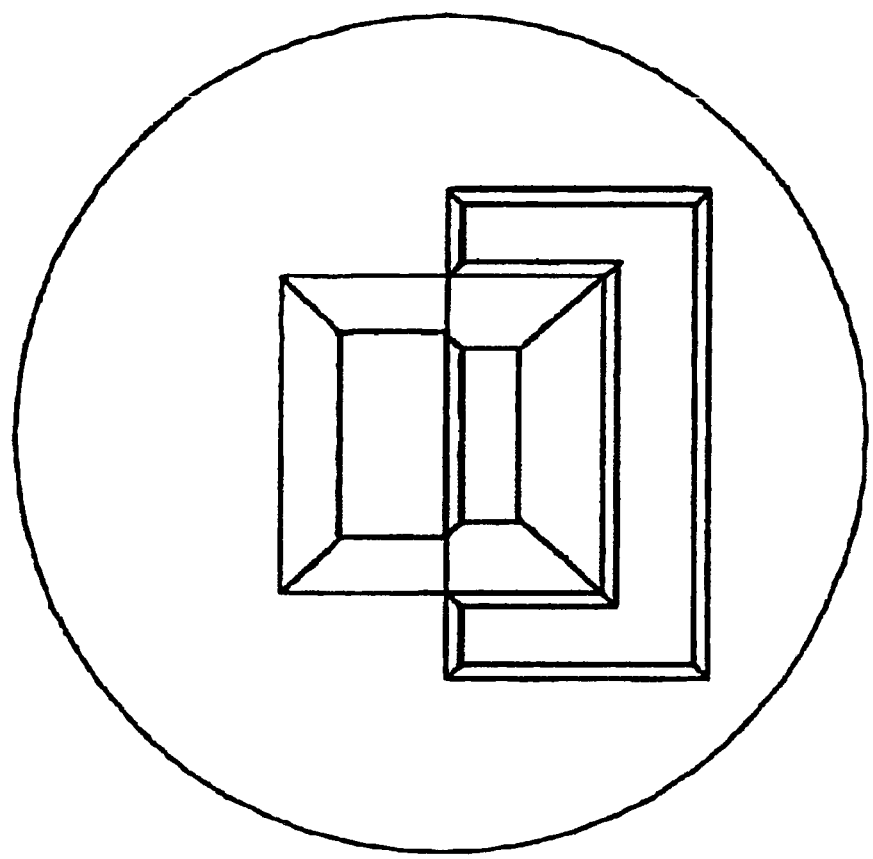
FIGS. 8A and 8B are explanatory diagrams showing a manufacturing method of the torsional resonator in the first embodiment of the invention.
Figure 8B:
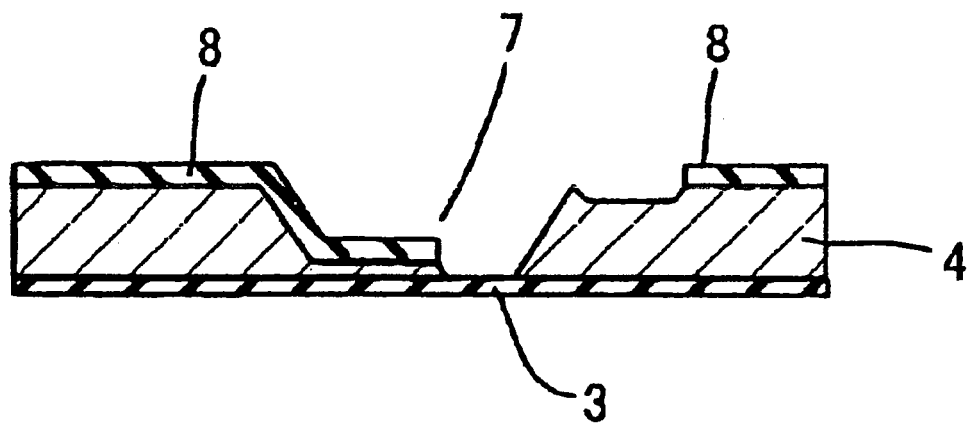

Anisotropic etching of silicon is performed from the back surface of the substrate 4 using KOH. When the etching proceeds until the front surface of the silicon substrate 4 is reached, the state is shown in FIGS. 8A and 8B.

Figure 9A:
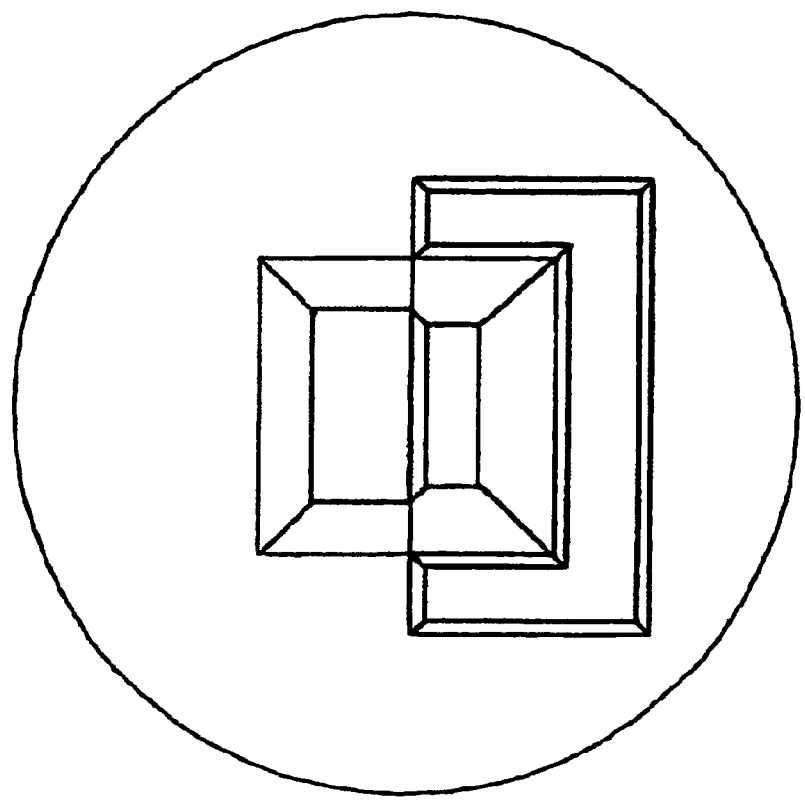
FIGS. 9A and 9B are explanatory diagrams showing a manufacturing method of the torsional resonator in the first embodiment of the invention.
Figure 9B:
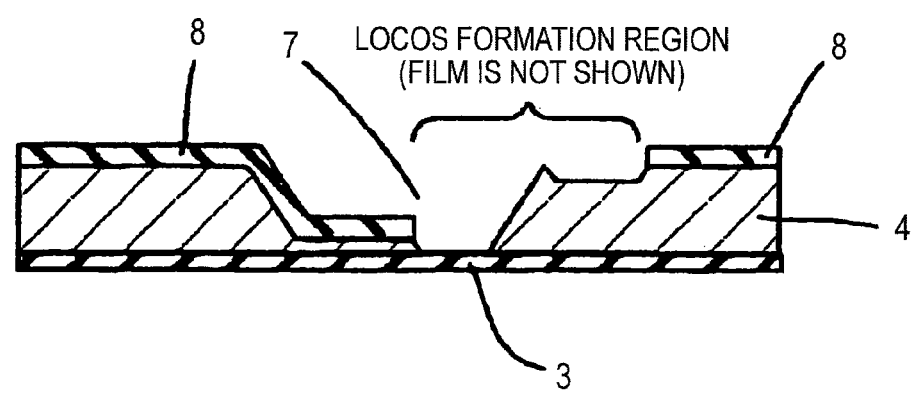
Figure 10A:
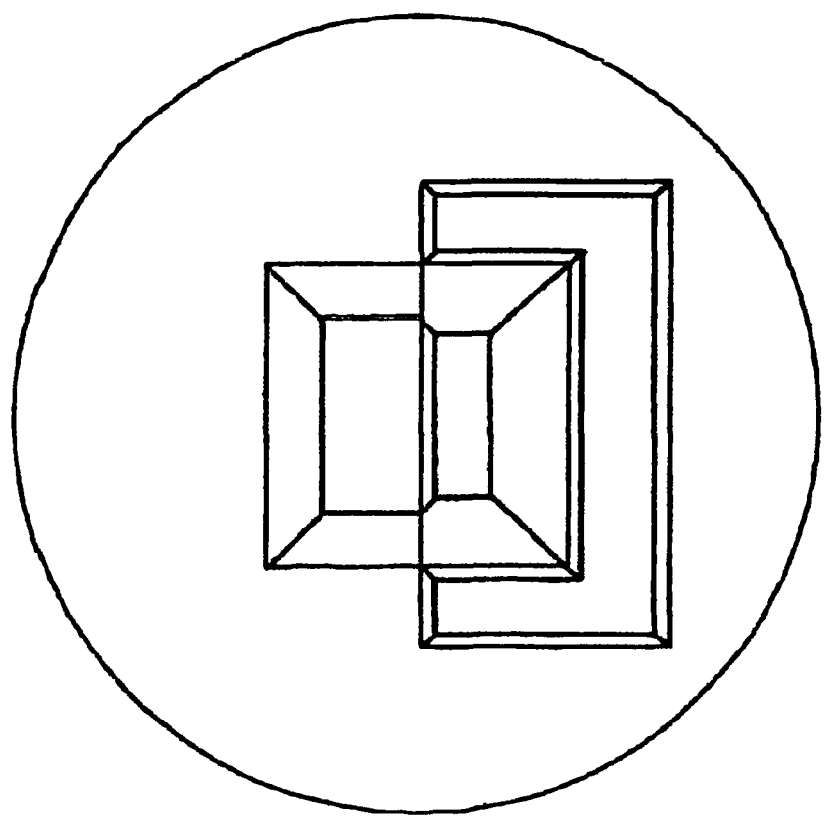
FIGS. 10A and 10B are explanatory diagrams showing a manufacturing method of the torsional resonator in the first embodiment of the invention.
Figure 10B:
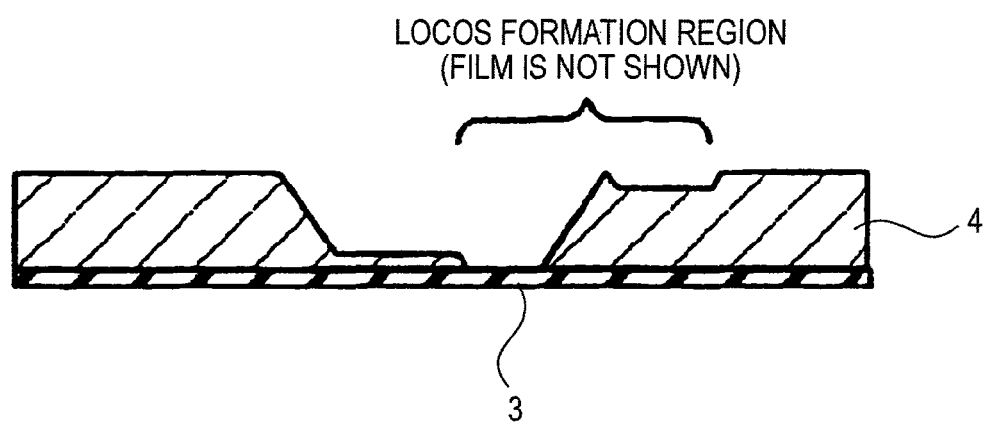

Next, a local silicon oxide film (LOCOS) is formed on the portion in which silicon is exposed to the back surface of the silicon substrate 4 (FIGS. 9A and 9B). For example, a silicon surface is oxidized by an oxidation furnace. FIGS. 10A and 10B show a state in which the LOCOS is left and the silicon nitride film is removed.

Figure 11A:
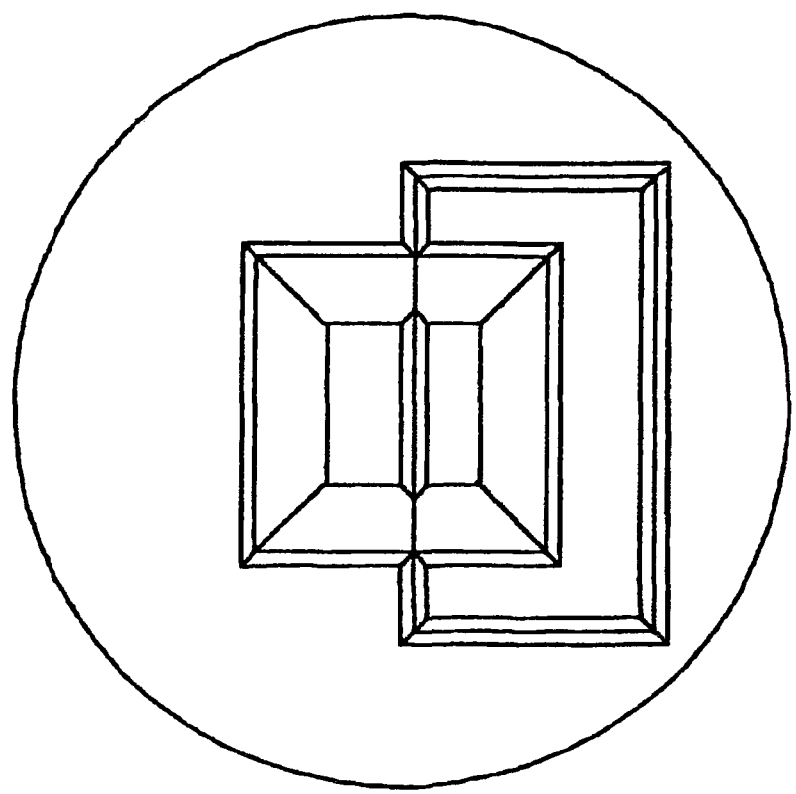
FIGS. 11A and 11B are explanatory diagrams showing a manufacturing method of the torsional resonator in the first embodiment of the invention.
Figure 11B:
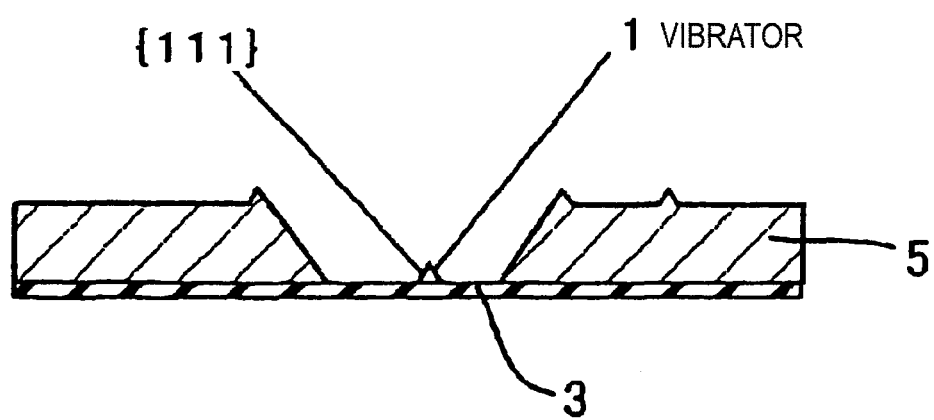

When anisotropic etching of silicon is again performed using KOH using the LOCOS as a mask, a vibrator of a straddle mounted beam with a triangular cross section can be formed as shown in FIGS. 11A and 11B. Three side surfaces of the beam are formed by two planes of {111} and one plane of {100}.

Figure 12:
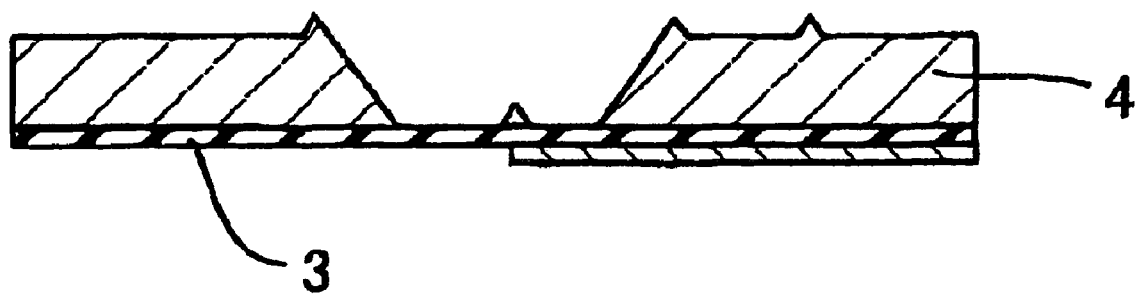
FIG. 12 is an explanatory diagram showing a manufacturing method of the torsional resonator in the first embodiment of the invention.

Then, as shown in FIG. 12, with respect to the front surface of the silicon substrate 4, an electrode 2 is deposited on a silicon oxide film 3 and is patterned. A polycrystalline silicon film formed by, for example, a CVD (chemical vapor deposition method) is used in the electrode 2. This patterning is formed so that the electrode 2 is opposed to a beam side surface to about a half the width of the beam. This is effective in the case of using the beam type vibrator 1 as a torsional vibrator. This is because the torsional moment is effectively caused to act on the vibrator 1 by electrostatic force between the vibrator 1 and the electrode 2.

Figure 13:
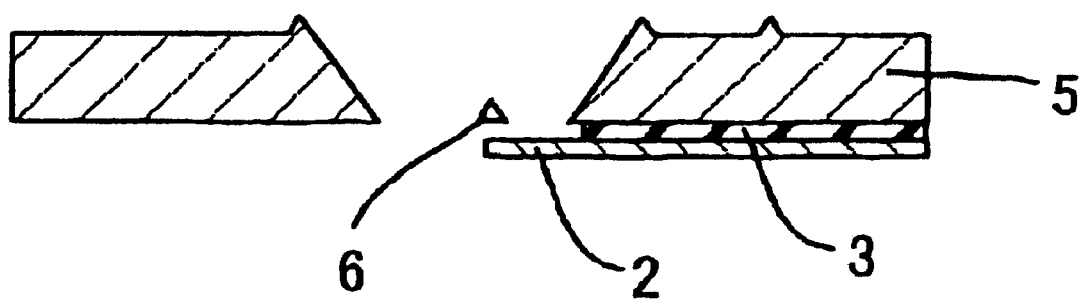
FIG. 13 is an explanatory diagram showing a manufacturing method of the torsional resonator in the first embodiment of the invention.

Finally, the silicon oxide film 3 is removed. This can be removed using, for example, hydrofluoric acid. Consequently, as shown in FIG. 13, a gap 6 is formed between the vibrator 1 and the electrode 2 and the vibrator 1 becomes a state capable of vibration and a capacity is formed between the vibrator 1 and the electrode 2. FIG. 13 is equal to the configuration of FIGS. 1 to 3.

Non-patent Reference 5: G. Hashiguchi and H. Mimura, "Fabrication of Silicon Quantum Wires Using Separation by Implanted Oxygen Wafer", Jpn. J. Appl. Phys, Vol. 33 (1994), pp. L1649-1650

According to the above manufacturing method, as shown in FIGS. 1 to 3, a thickness of the support part 5 of the beam type vibrator 1 can be made thicker than a thickness of the beam and the support part can be formed robustly. Also, since the vicinities of connection between the vibrator and the support parts are symmetrical with respect to the axis of B-B' of a length direction of the vibrator 1, one side of the support part does not retract in the length direction of the beam as shown in FIG. 36 of the conventional example, so that the support part has a more robust structure. Therefore, the amount in which vibration of the vibrator 1 leaks to the support part can be reduced and a resonator having a high Q value can be constructed.

Also, since a material of the beam type vibrator 1 is the same single-crystal material as the substrate 4, there is no loss of vibration energy at a crystal grain boundary surface as seen in a vibrator of a polycrystalline material, so that the resonator having a high Q value can be constructed.

Also, since a side surface of the beam type vibrator 1 is constructed of a crystal plane of silicon, a surface texture is extremely smooth and loss of vibration energy resulting from surface roughness is reduced and the resonator having a high Q value can be constructed.

Also, the manufacturing method shown in FIGS. 4 to 13 is a manufacturing method useful for fabrication of a fine beam type vibrator having a resonance frequency at several hundreds MHz to several GHz since a structural object with thinness exceeding a limit of a patterning width in a semiconductor process can be formed. For example, when a length of a beam is set at 1.6 μm, a vibrator having a torsional resonance frequency at 1.2 GHz can be provided.

In addition, TMAH (Tetramethyl Ammonium Hydroxide) or EDP (a mixture of water, pyrocaterol, ethylenediamine) instead of KOH may be used in the anisotropic etching.

Second Embodiment

In addition, a cross section of the beam type vibrator 1 is formed in the triangular shape, but can also be formed in a trapezoidal shape. A manufacturing method of a resonator having this trapezoidal-shaped vibrator will be described as a second embodiment of the invention.

Figure 4A:
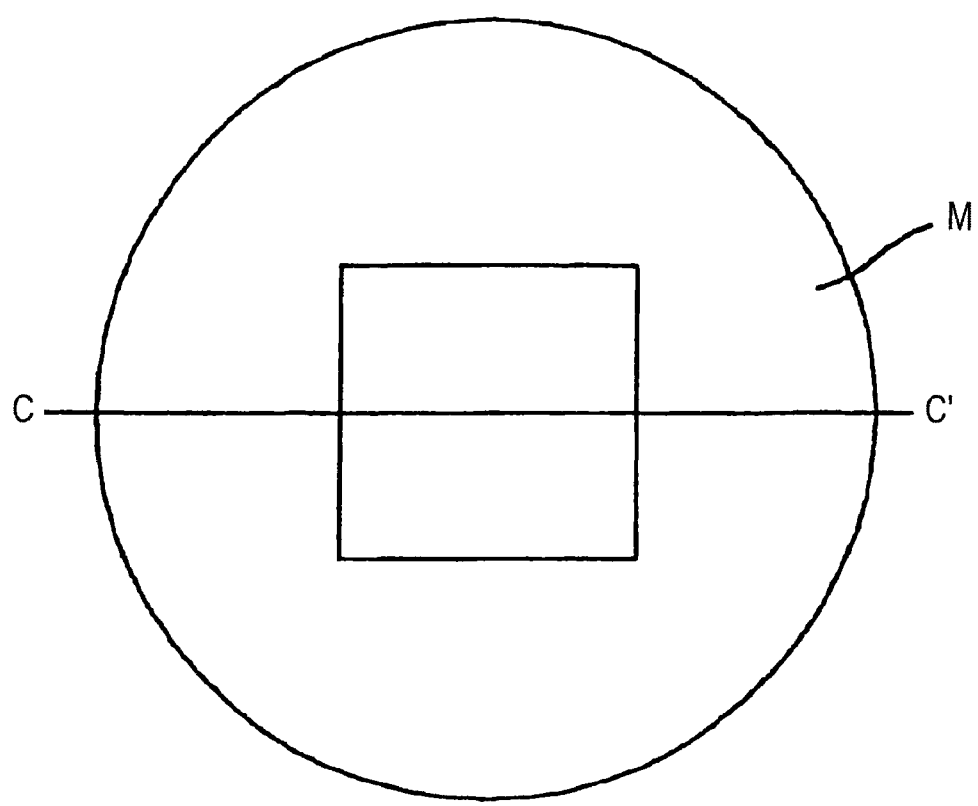
FIGS. 4A and 4B are explanatory diagrams showing a manufacturing method of the torsional resonator in the first embodiment of the invention.
Figure 4B:
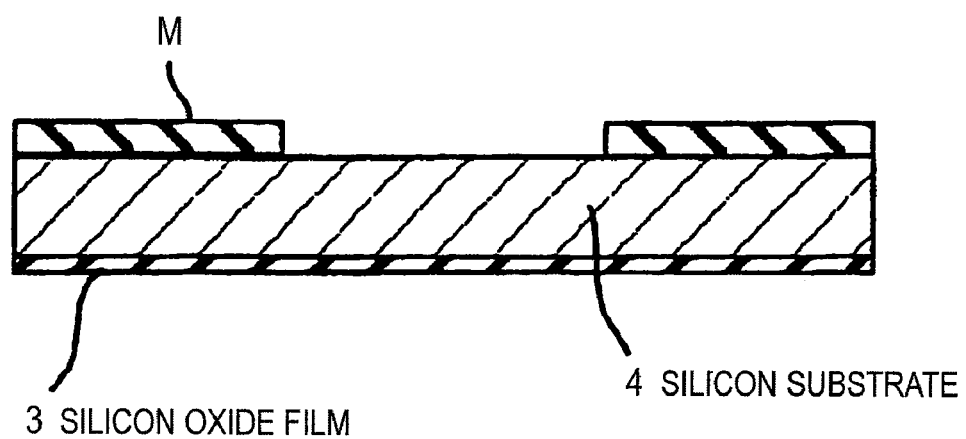
Figure 14A:
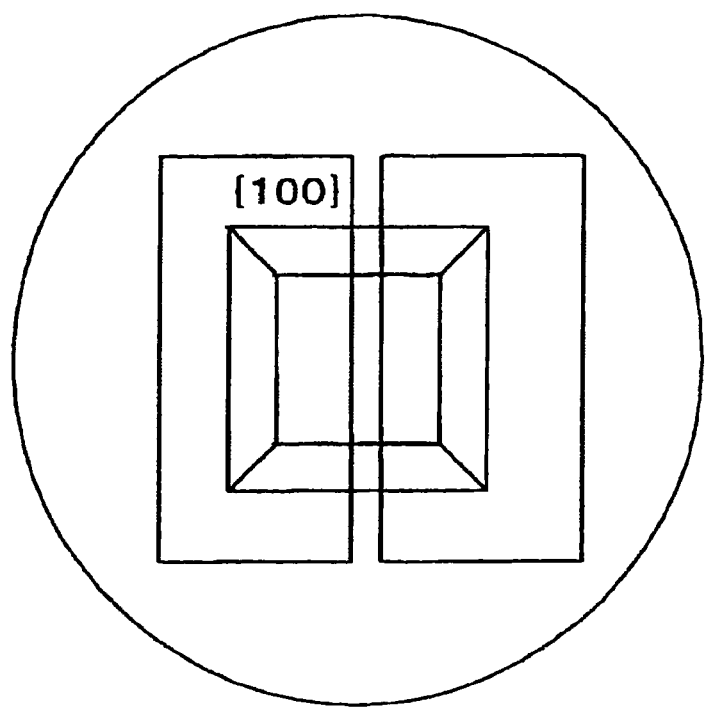
FIGS. 14A and 14B are explanatory diagrams showing a manufacturing method of a torsional resonator by a beam with a trapezoidal cross section in a second embodiment of the invention.
Figure 14B:
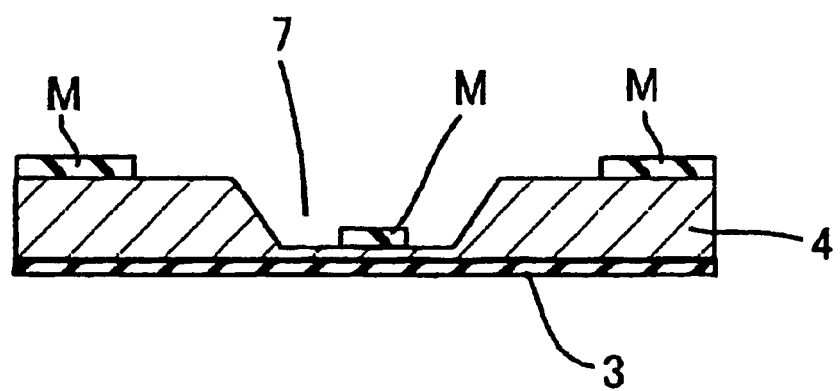
Figure 15A:
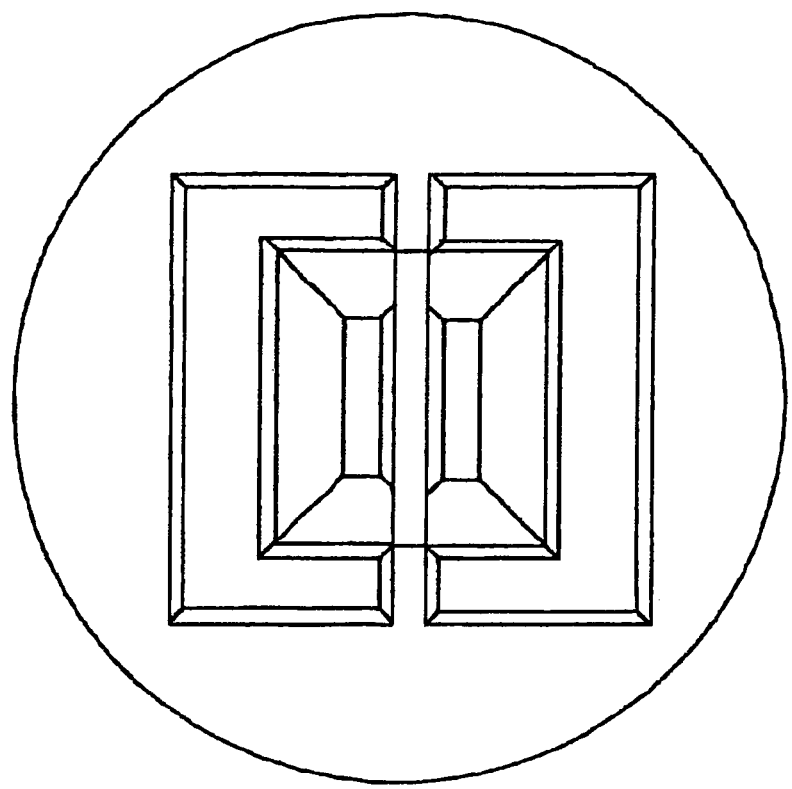
FIGS. 15A and 15B are explanatory diagrams showing a manufacturing method of the torsional resonator by the beam with the trapezoidal cross section in the second embodiment of the invention.
Figure 15B:
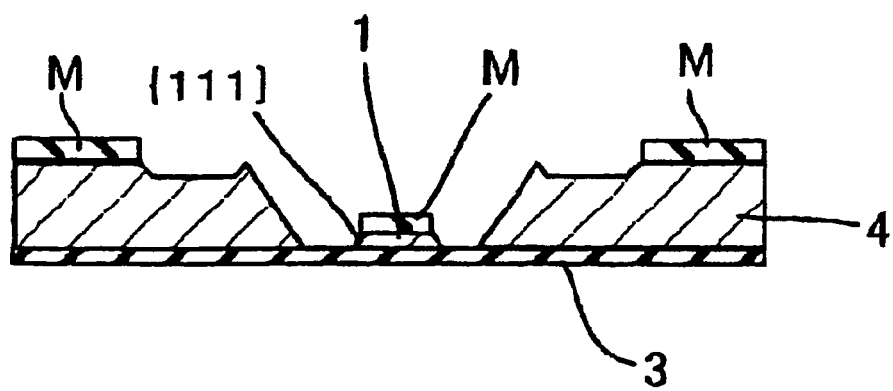
Figure 16A:
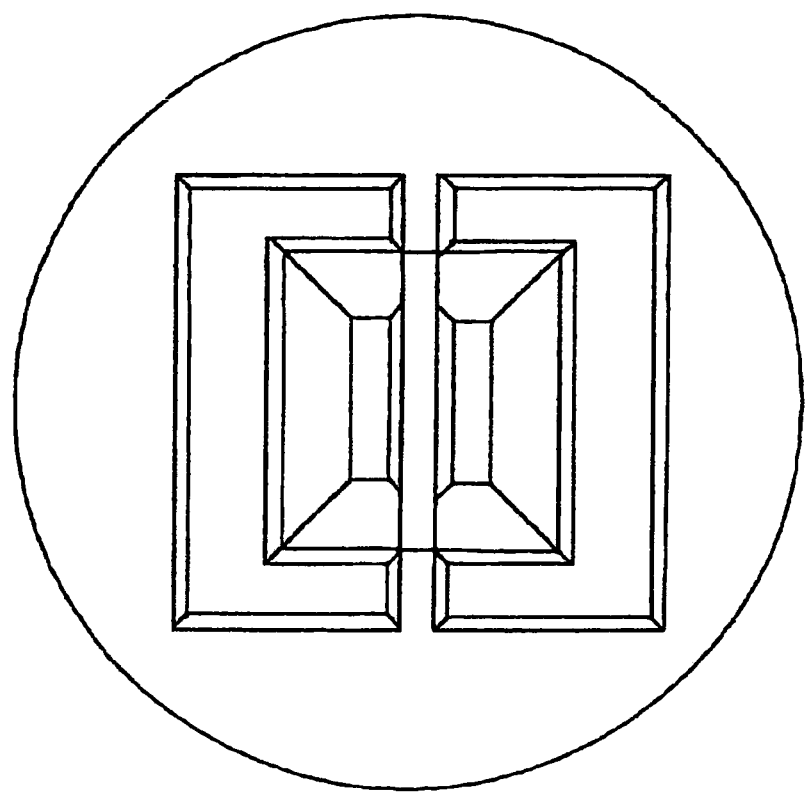
FIGS. 16A and 16B are explanatory diagrams showing a manufacturing method of the torsional resonator by the beam with the trapezoidal cross section in the second embodiment of the invention.
Figure 16B:
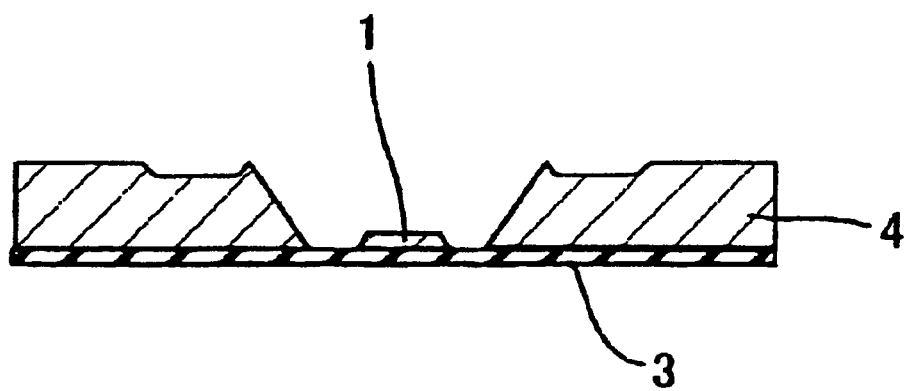
Figure 17:
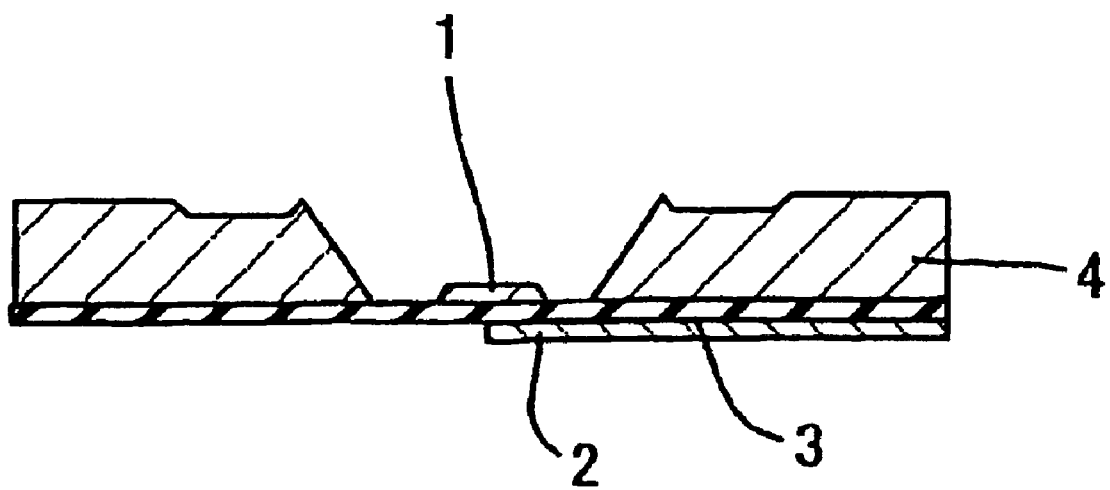
FIG. 17 is an explanatory diagram showing a manufacturing method of the torsional resonator by the beam with the trapezoidal cross section in the second embodiment of the invention.
Figure 18:
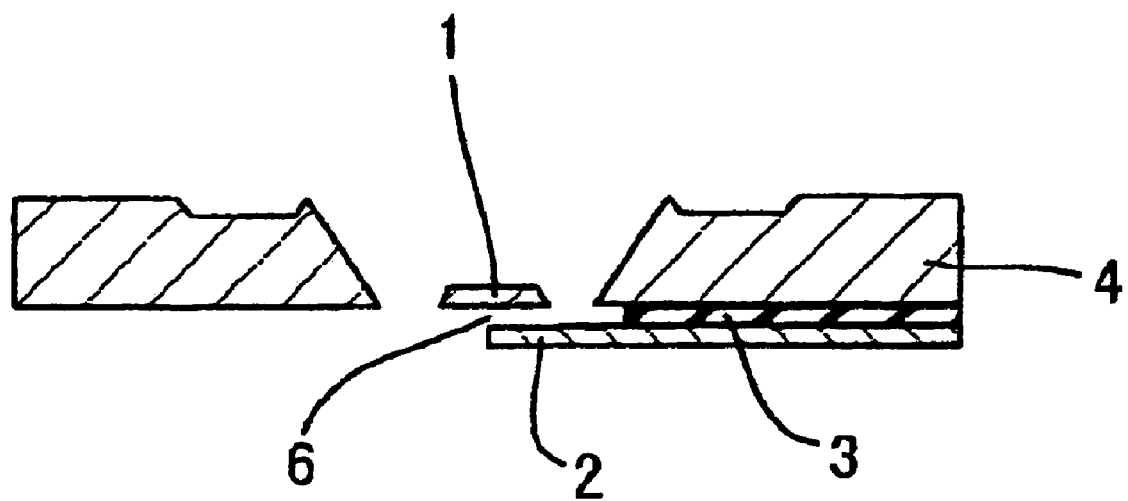
FIG. 18 is an explanatory diagram showing a manufacturing method of the torsional resonator by the beam with the trapezoidal cross section in the second embodiment of the invention.

In the present embodiment, a vibrator with a trapezoidal cross section can be formed by being fabricated similarly from FIGS. 4 to 6 and being changed subsequently as shown in FIGS. 14A and 14B. In FIGS. 14A and 14B, a silicon nitride film is deposited on a back surface (upper side in the drawing) of a substrate 4 and two quadrilateral windows are formed in the silicon nitride film. At this time, the linear silicon nitride film 8 having a certain width traverses a cavity 7 and is formed along a plane of {111}. When anisotropic etching of silicon is performed using KOH, a vibrator of a straddle mounted beam with a trapezoidal cross section can be formed as shown in FIGS. 15A and 15B. Four side surfaces of the trapezoid are formed by two planes of {111} and two planes of {100}. FIGS. 16A and 16B are a state in which the silicon nitride film is removed, and FIG. 17 is a state in which an electrode 2 of polycrystalline silicon is formed on a silicon oxide film 3 on a front surface (lower side in the drawing) of the silicon substrate 4 and is patterned. This patterning is formed so that the electrode 2 is opposed to about a half the width of the beam. This is because the torsional moment is caused to act on the vibrator 1 by electrostatic force between the vibrator 1 and the electrode 2, and a torsional resonator can be constructed by this configuration. Finally, the silicon oxide film is removed (FIG. 18). This can be removed using, for example, hydrofluoric acid. A gap 6 is formed between the vibrator 1 and the electrode 2 and the vibrator 1 becomes a state capable of vibration. The steps of FIGS. 14 to 18 are characterized in that the resonator can be formed by the number of steps smaller than the steps of FIGS. 4 to 13 in which the triangular cross section is obtained.

Third Embodiment

Figure 19:
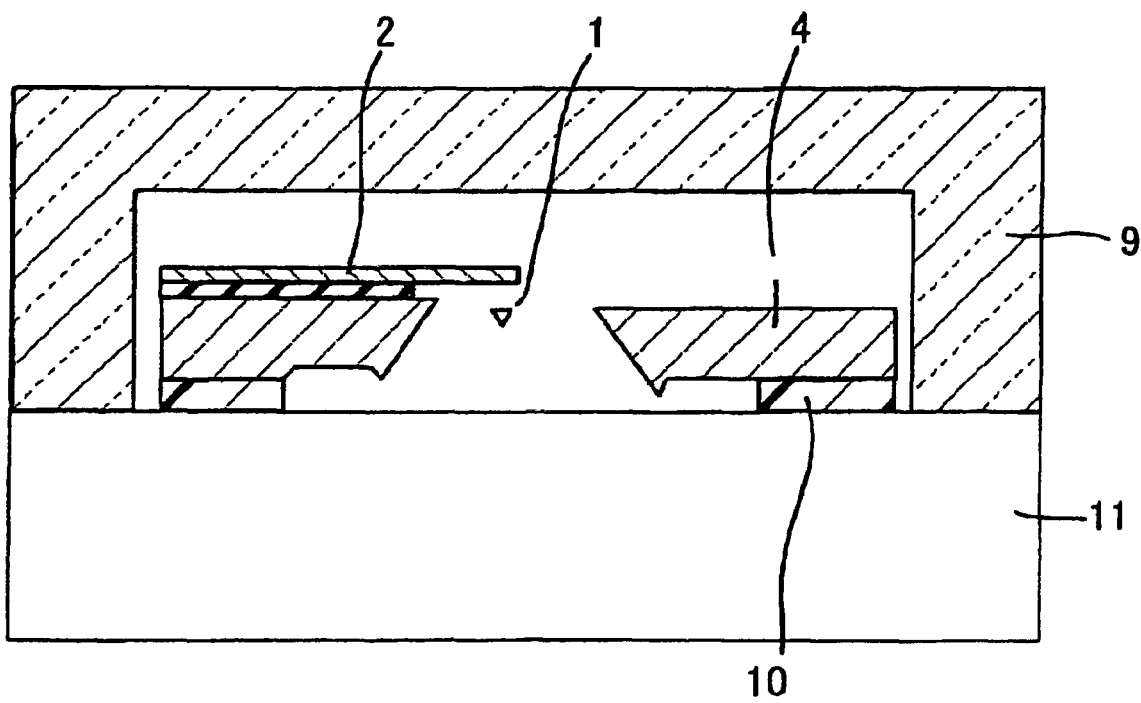
FIG. 19 is an explanatory diagram of a state of sealing a resonator in a third embodiment of the invention in a vacuum.

Also, this resonator may be constructed so as to be accommodated inside a case in which the atmosphere is sealed in a vacuum as shown by one example in FIG. 19. In this case, a silicon substrate 4 is bonded to a silicon base 11 through an adhesive layer 10 such as an adhesive. Further, the resonator is included by a recessed part of a glass cap 9 and the silicon base 11, and the glass cap 9 is bonded to the silicon base 11 by anode bonding while vacuuming the inside. By this configuration, the resonator for reducing loss of vibration energy of a vibrator 1 by viscosity of air can be provided while the resonator with high protection can be formed.

Fourth Embodiment

Figure 20:
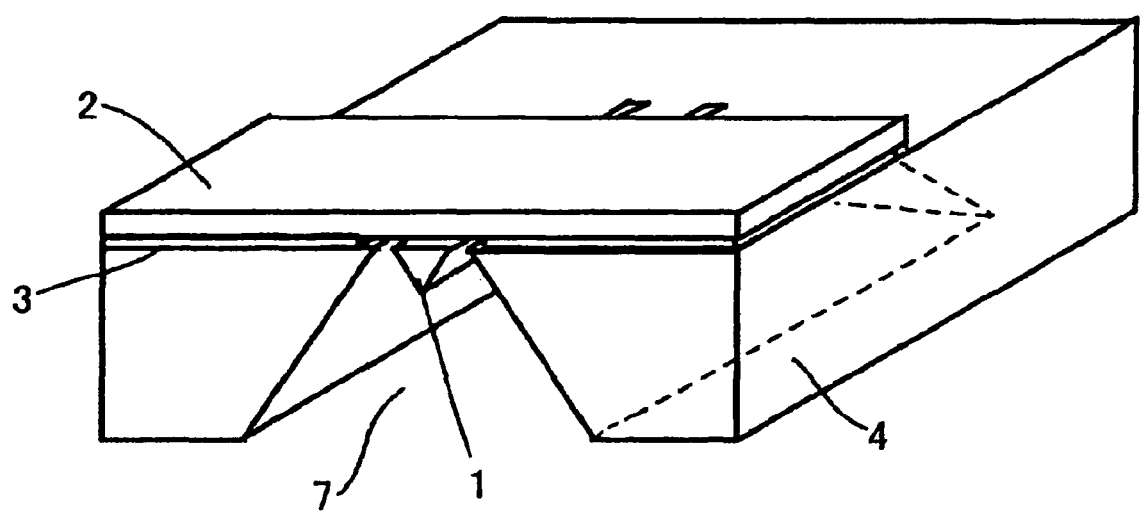
FIG. 20 is a cross sectional view of a flexural resonator in a fourth embodiment of the invention.

Also, a flexural resonator can be constructed by changing a configuration of the electrode of the torsional resonator shown in FIGS. 1 to 3. FIG. 20 shows a cross sectional view of the flexural resonator. An electrode 2 is opposed to the whole area of a width direction of a vibrator 1 through a gap and a capacity is formed. By the present configuration, excitation force in which the vibrator 1 flexurally vibrates in a substrate thickness direction can be applied by electrostatic force.

Fifth Embodiment

Figure 21:
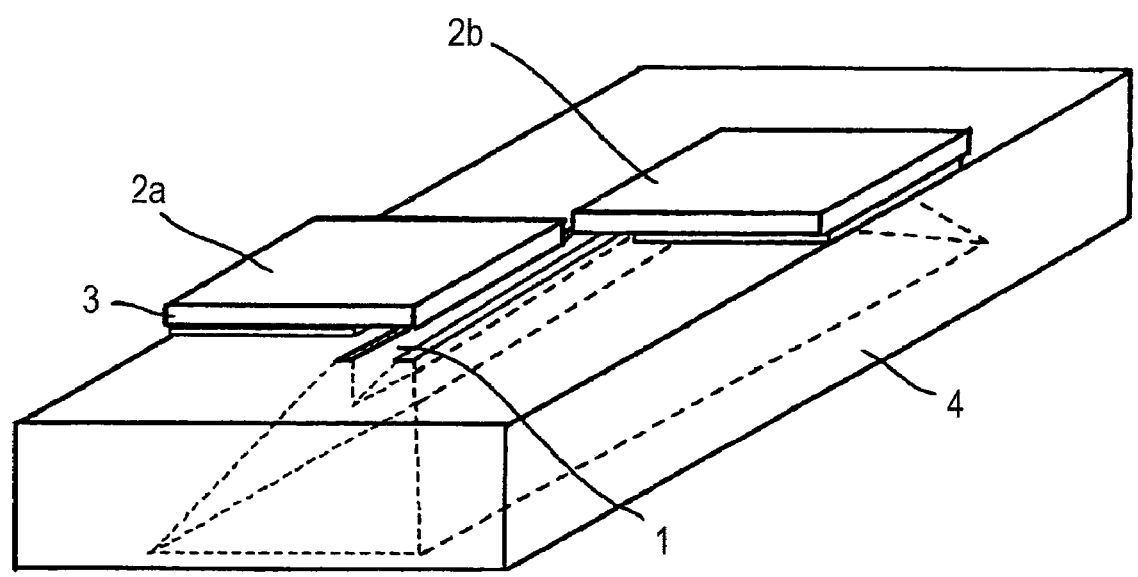
FIG. 21 is a perspective view of a resonator using second-order flexural vibration in a fifth embodiment of the invention.

Also, a high-order resonance mode can be excited with respect to a vibrator since there are plural electrodes according to a resonance mode order which wants to be excited with respect to the vibrator. FIG. 21 is a configuration in which the number of electrodes of the torsional resonator of FIG. 1 is two. Electrodes 2a, 2b are positioned at a site at which excitation force is applied to two antinodes of a second-order torsional mode and its vicinity in order to excite second-order torsional vibration of a beam. That is, the portion in which the electrodes 2a, 2b are opposed to a side surface of the beam is set at the site of about a half the length of the beam and about a half the width of the beam.

Also in this case, a uniform beam having extremely high dimension accuracy can be formed, so that a resonator with high reliability can be provided.

Sixth Embodiment

Figure 22:
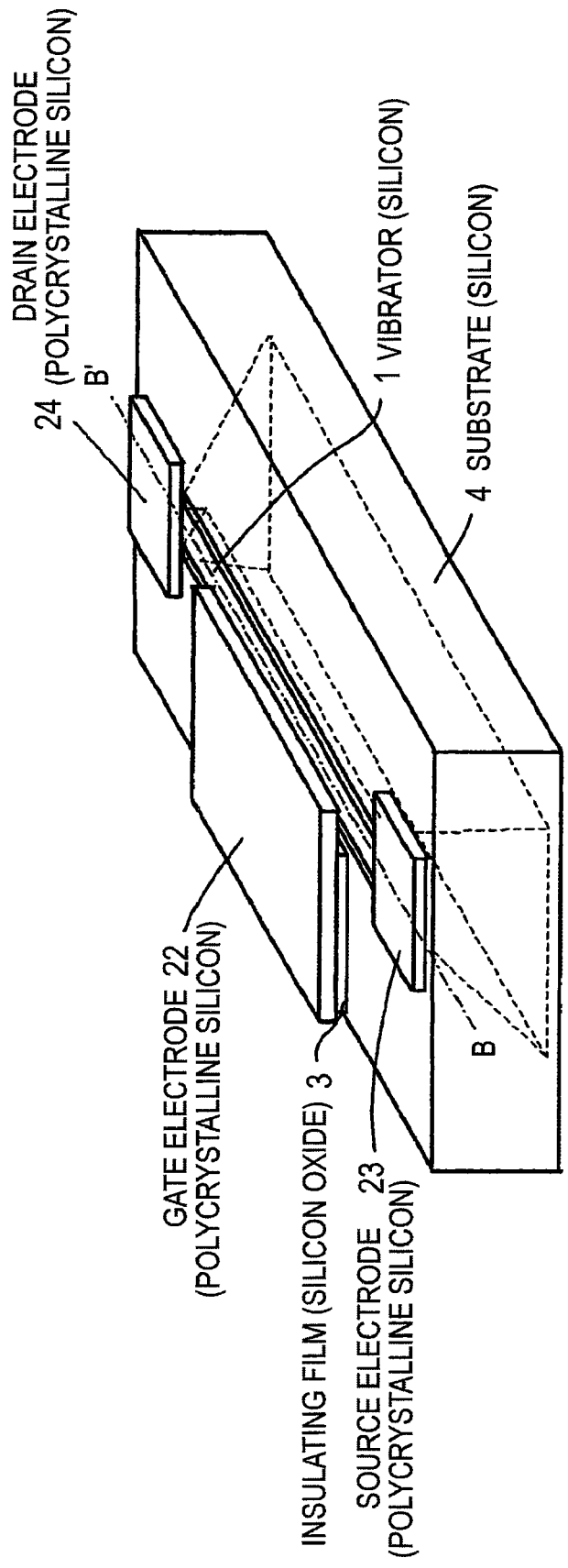
FIG. 22 is a perspective view of a MOS transistor including a torsional resonator in a sixth embodiment of the invention.
Figure 23:
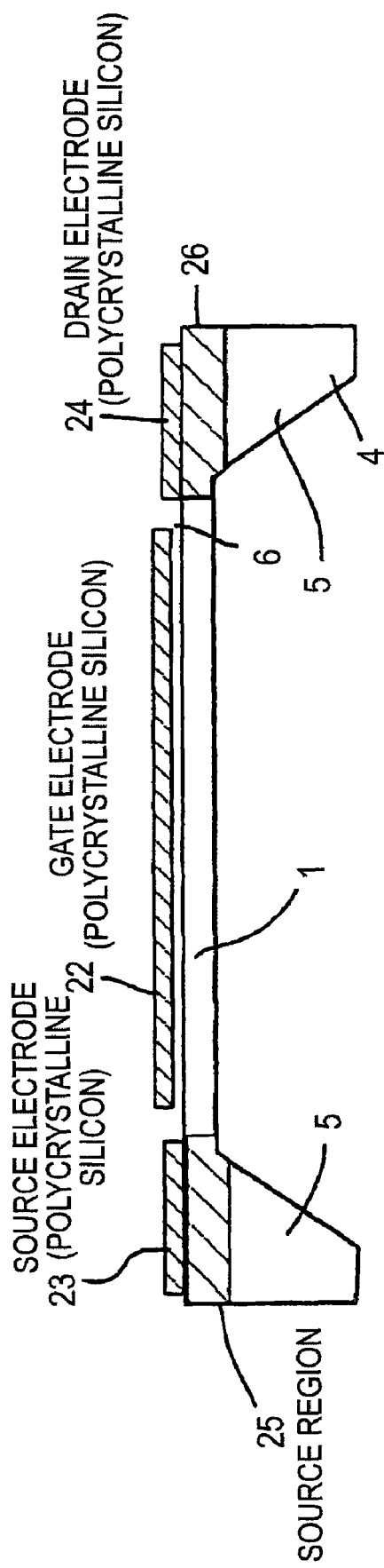
FIG. 23 is a cross sectional view of a configuration of FIG. 22.

Also, a configuration of fetching an output signal from a resonator and amplifying the signal can be added in substantially the same configuration as FIG. 1. FIG. 22 newly disposes two electrodes on support parts 5 of both ends of a vibrator 1 in the resonator of FIG. 1. An electrode on the vibrator 1 is set at a gate electrode 22 and one electrode on the support part 5 is set at a drain electrode 24 and the other electrode is set at a source electrode 23. FIG. 23 is a longitudinal cross sectional view of B-B' of FIG. 22. A substrate 4 and the vibrator 1 are an N-type semiconductor, and a drain region 26 made of a p+ diffusion region is formed in the substrate under the drain electrode 24 and a source region 25 made of a p+ diffusion region is formed in the substrate under the source electrode 23. That is, the whole resonator is a p channel MOS transistor and an oxide film of a MOS structure is replaced with a gap 6 and vibration of the vibrator 1 is enabled. The vibrator 1 is subjected to electrostatic force between the vibrator 1 and the gate electrode 22 and torsional vibration of large amplitude is produced in the vicinity of a resonance frequency and modulation is given to formation of a channel of the inside of the vibrator 1, with the result that a drain current involved is obtained. According to such a configuration, as compared with the case of individually fabricating a resonator and an amplifier and making connection between both of the resonator and the amplifier by wiring, an element can be miniaturized and also superposition of noise or loss resulting from the wiring can be reduced.

A gate vibration type MOSFET for vibrating a gate electrode has been devised conventionally, but polycrystalline silicon or a metal thin film is normally used in a gate electrode material, so that loss of vibration energy at a crystal grain boundary occurs and a resonator with a high Q value cannot be constructed, but by constructing a vibrator of single-crystal silicon thus, the vibrator corresponding to a channel constructed of the single-crystal silicon vibrates, so that an amplifier and a resonator with a high Q value can be formed.

Also, in the present embodiment, as a material of the substrate 4, silicon is used, but a semiconductor material such as SiGe can also be used.

Also, by electrically placing the resonators of the present embodiment in parallel, an electrical impedance of the resonator is reduced and electrical impedance matching between the resonator and a signal circuit of the outside of the resonator can be improved.

Also, the vibrator of the present embodiment is formed by processing the silicon substrate, but the vibrator may be formed by processing an SOI layer of an SOI (Silicon On Insulator) substrate. Since there is also the SOI substrate having a thin SOI layer with the order of μm or the order of nm, it can be used in the case of forming a beam type vibrator having a resonance point at a very small UHF band with an extremely thin thickness and a short length.

Seventh Embodiment

Figure 24:
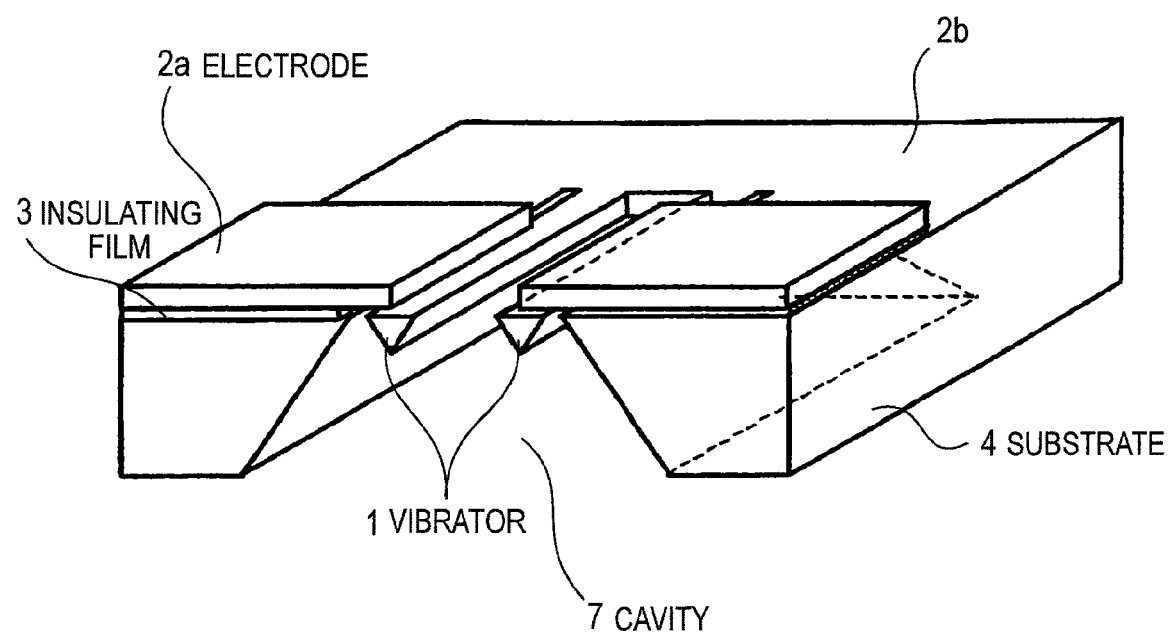
FIG. 24 is a perspective view of a torsional resonator in a seventh embodiment of the invention.

Next, a seventh embodiment of the invention will be described. In the torsional resonator of FIG. 1 in the first embodiment, one vibrator is formed in the bottom of the cavity, but plural vibrators can be formed simultaneously. FIG. 24 shows a perspective view of the case of forming two vibrators. With respect to each of the vibrators, electrodes 2a, 2b are placed through gaps. In this case, it is a torsional resonator, so that both the electrodes 2a, 2b are formed so as to oppose the electrodes to the vibrators to about a half area of a width direction of the beam type vibrator and are configured to effectively excite torsional vibration.

Figure 25A:
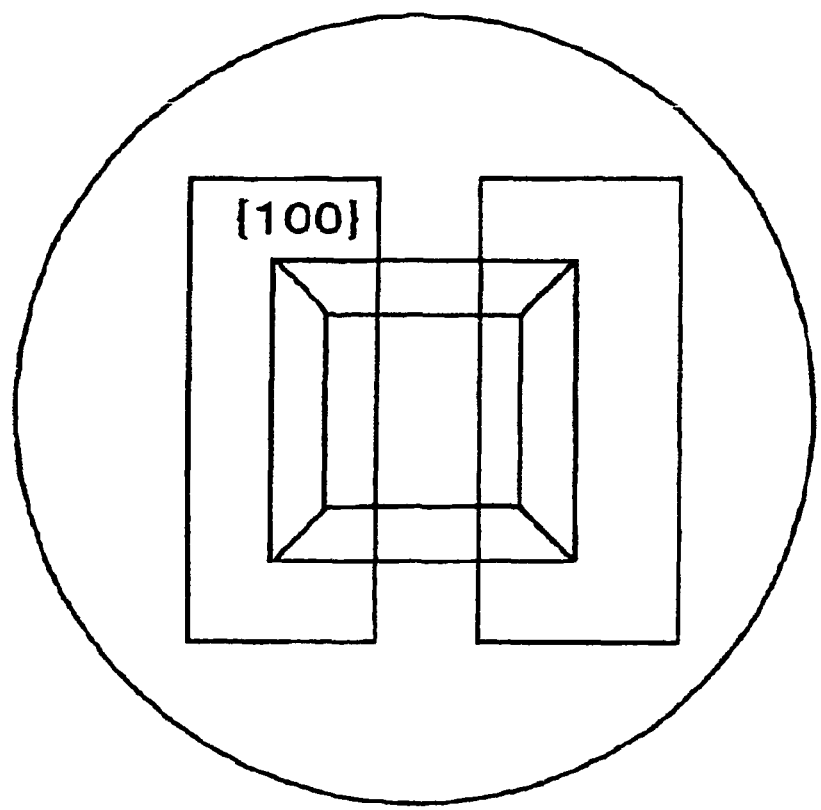
FIGS. 25A and 25B are explanatory diagrams of a manufacturing method of the torsional resonator in the seventh embodiment of the invention.
Figure 25B:
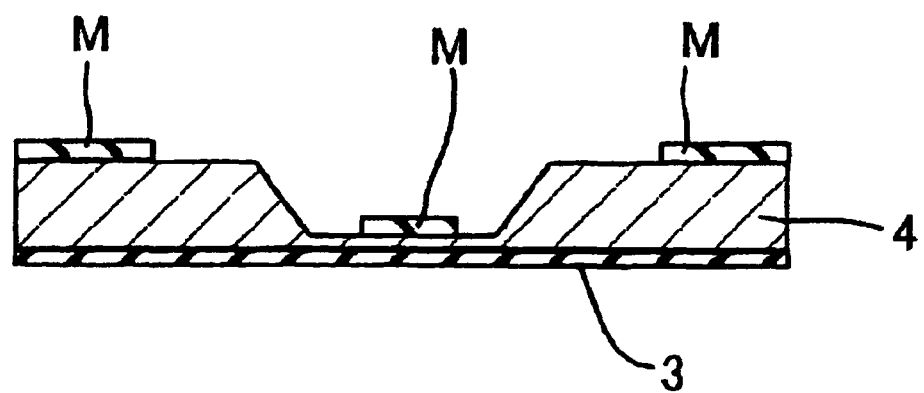
Figure 26A:
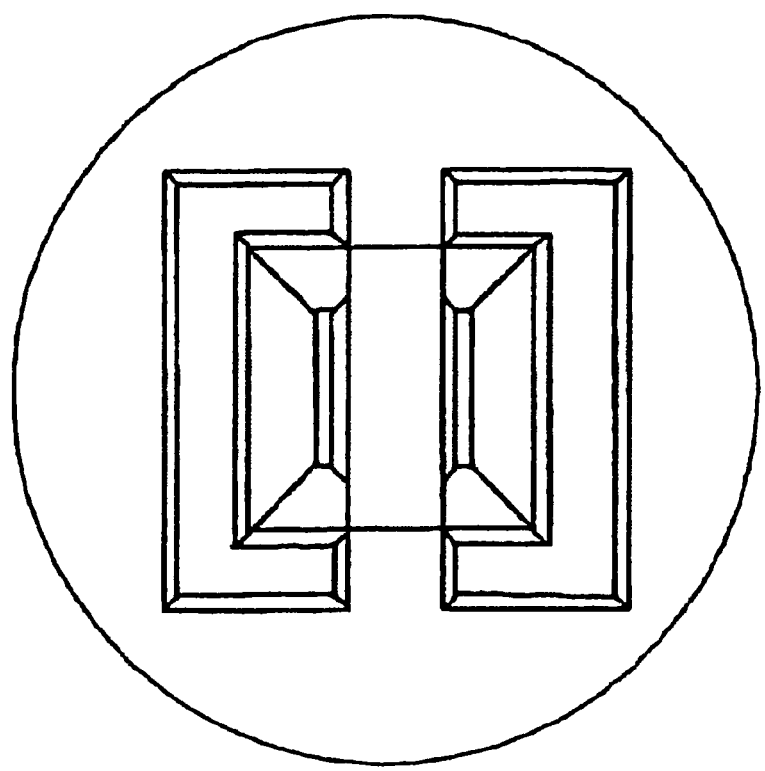
FIGS. 26A and 26B are explanatory diagrams of a manufacturing method of the torsional resonator in the seventh embodiment of the invention.
Figure 26B:
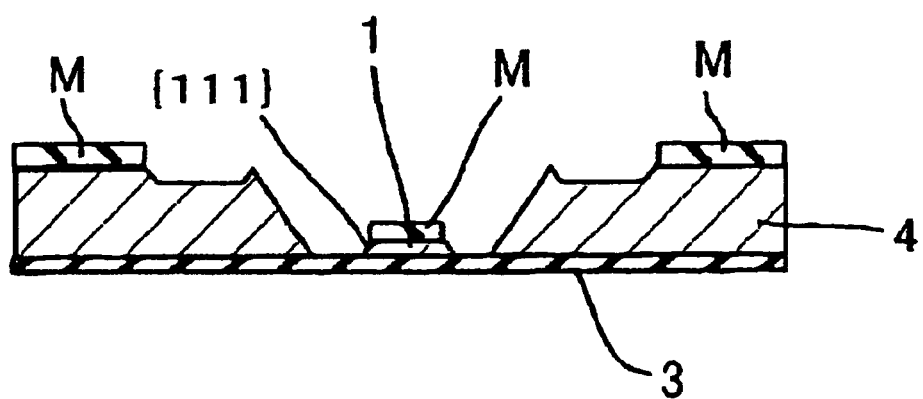
Figure 27A:
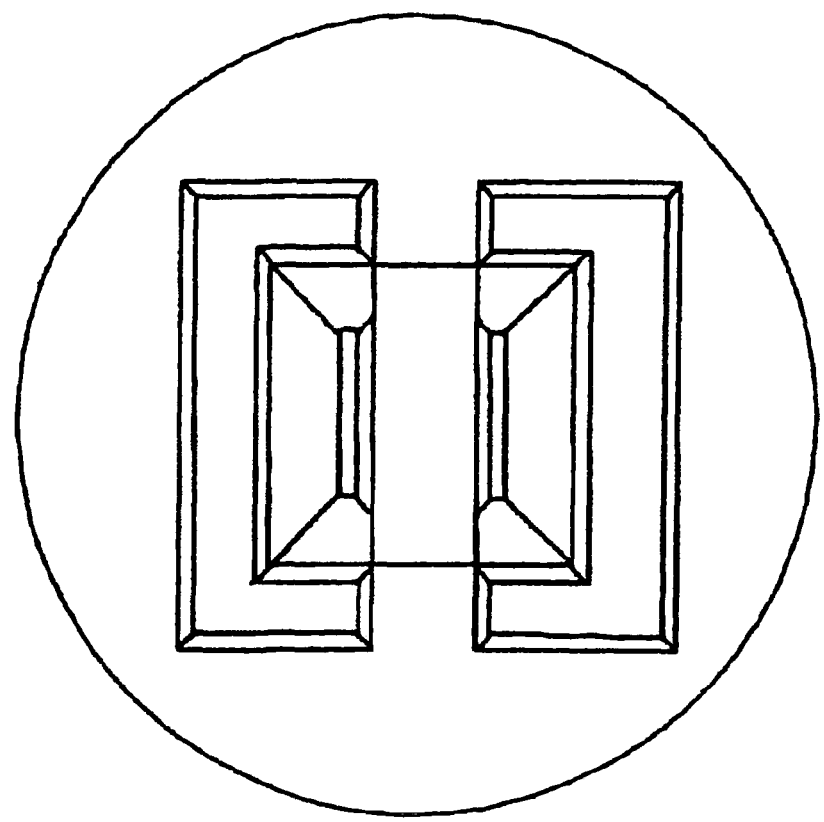
FIGS. 27A and 27B are explanatory diagrams of a manufacturing method of the torsional resonator in the seventh embodiment of the invention.
Figure 27B:
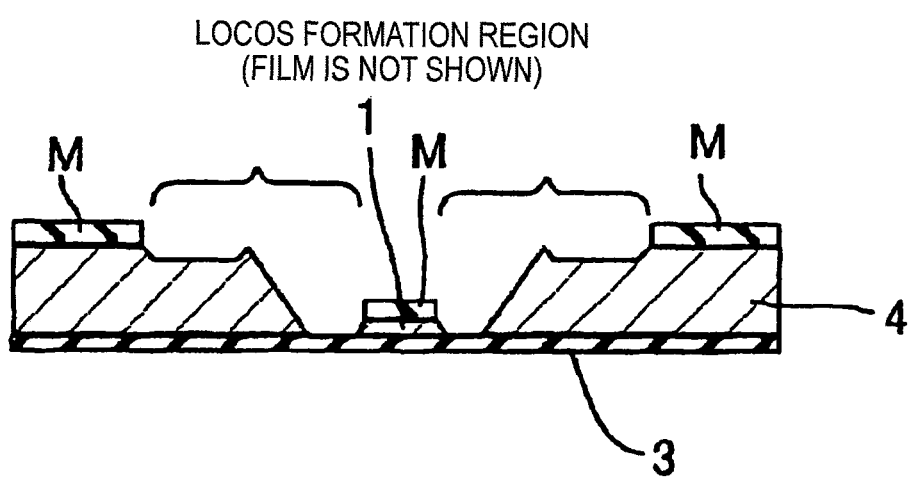

The resonator can be formed by being fabricated similarly in the steps of FIGS. 4 to 6 and being changed subsequently as shown in FIG. 25. In FIGS. 25A and 25B, a silicon nitride film is deposited on a back surface (upper side in the drawing) of a substrate 4 and two quadrilateral windows are formed in the silicon nitride film. At this time, the linear silicon nitride film having a certain width traverses a cavity and is formed along a plane of {111}. When anisotropic etching of silicon is performed using KOH, the state is shown in FIGS. 26A and 26B. A LOCOS is formed on the portion in which silicon is exposed to the back surface of the substrate 4 (FIGS. 27A and 27B) and the silicon nitride film is removed (FIGS. 28A and 28B) and when anisotropic etching of silicon is again performed using KOH using the LOCOS as a mask, two beam type vibrators with triangular cross sections can be arranged and formed as shown in (FIG. 29).

Figure 28A:
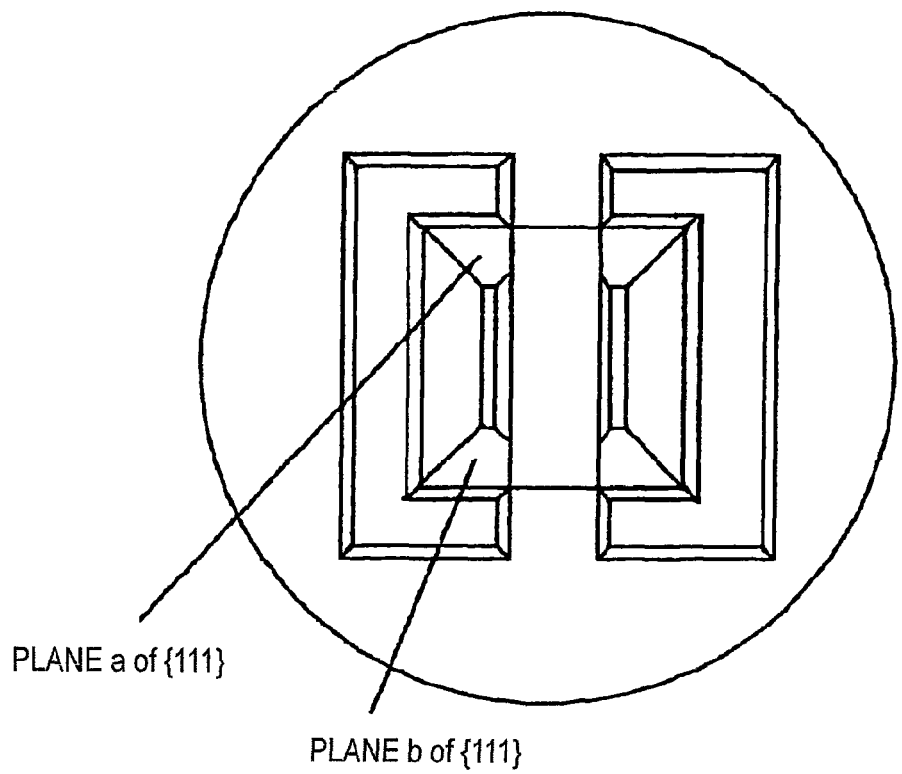
FIGS. 28A and 28B are explanatory diagrams of a manufacturing method of the torsional resonator in the seventh embodiment of the invention.
Figure 28B:
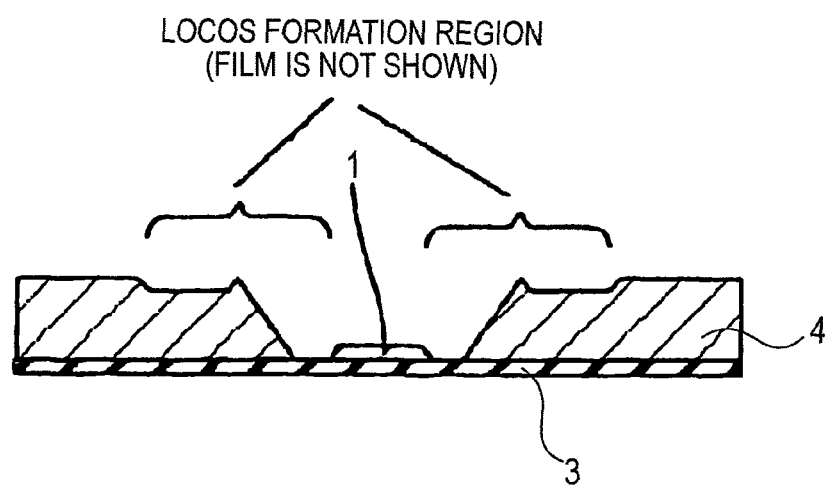
Figure 29:
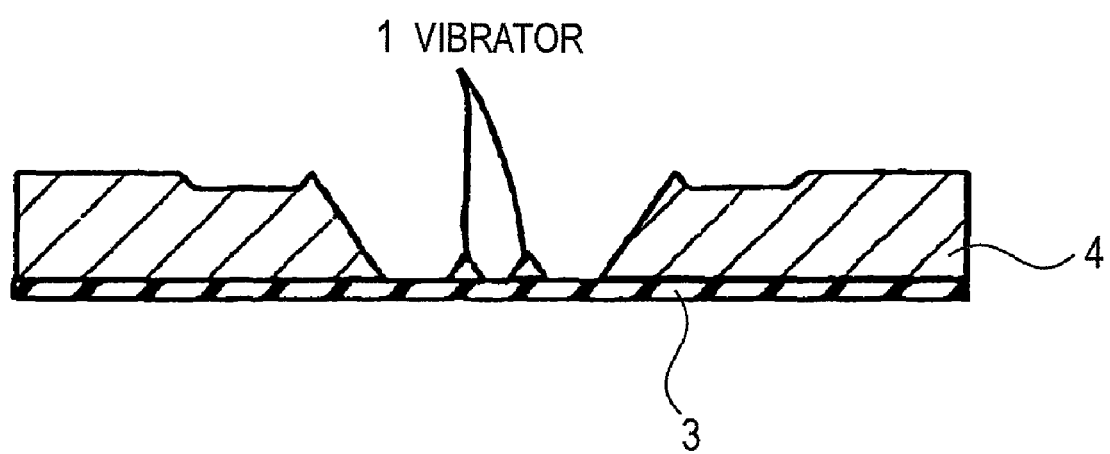
FIG. 29 is an explanatory diagram of a manufacturing method of the torsional resonator in the seventh embodiment of the invention.

Since a plane a of {111} and a plane b of {111} shown in FIGS. 28A and 28B are crystal planes, two beam type vibrators having these planes on end faces become the same length with high accuracy. That is, resonance frequencies of the two beam type vibrators become the same. A resonance frequency of flexural vibration depends on a thickness and a length of the beam, but particularly in a resonance frequency of torsional vibration, thickness dependence is extremely smaller than length dependence, so that the present configuration serves as effective means in the case of forming plural vibrators having the same torsional resonance frequency.

In the configuration shown in FIG. 24, as the vibrator becomes finer, capacitance between the electrode and the vibrator becomes small and an electrical impedance becomes large and a mismatch of the electrical impedance tends to occur and energy of an input AC signal becomes resistant to being converted into mechanical vibration of the vibrator efficiently. However, the impedance can be decreased by connecting plural pairs of the plural electrodes and vibrators having the same resonance frequency in parallel as shown in FIG. 24.

Figure 30:
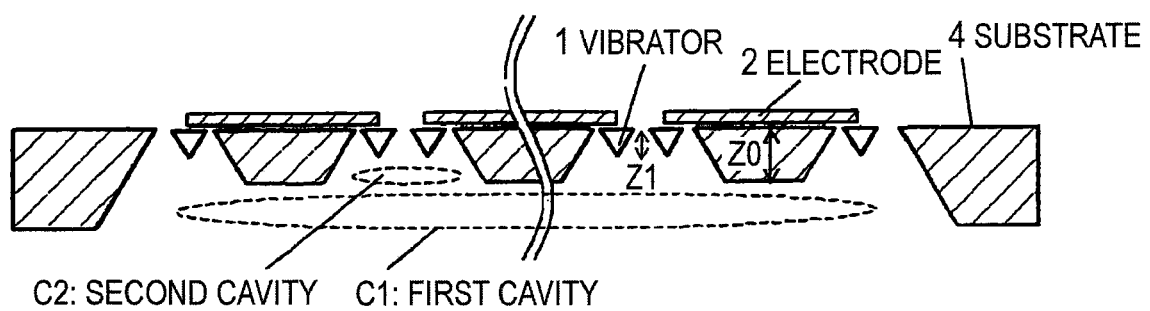
FIG. 30 is a cross sectional view showing a modified example of the resonator in the seventh embodiment of the invention.

In addition, FIG. 30 shows a configuration of the case of forming more vibrators having the same resonance frequency. FIG. 30 is a cross sectional view in which a cross section of a beam is seen. A feature herein is that a first cavity C1 is formed. Subsequently, a method of formation of the vibrators shown in FIGS. 4 to 6 and FIGS. 25 to 29 is performed with respect to a bottom surface of the first cavity C1. Finally, the first cavity C1 and a second cavity C2 are formed in a substrate 4 and plural vibrators are formed between a bottom surface of the second cavity C2 and a front surface of the substrate 4. According to the present configuration, an electrode 2 is robustly fixed while the plural vibrators with the same length can be formed. That is, a thickness Z0 between the bottom surface of the first cavity and the front surface of the substrate 4 can be made sufficiently thicker than a thickness Z1 of the beam, so that the electrode 2 can be formed at a robust site on the substrate. Consequently, the amount of displacement of the electrode itself due to electrostatic force between the electrode and the vibrator or a shock from the outside can be reduced.

Eighth Embodiment

Figure 31:
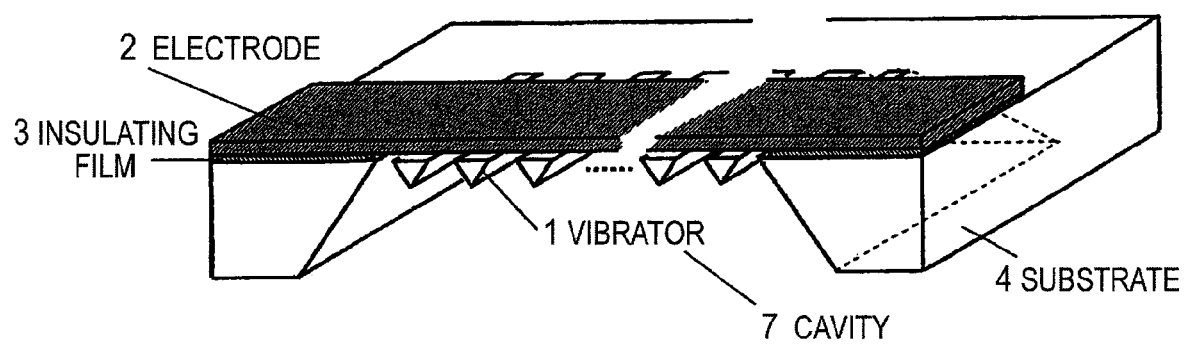
FIG. 31 is a cross sectional view showing a modified example of the resonator in the seventh embodiment of the invention.

Next, FIG. 31 shows another configuration of a low-impedance resonator using a torsional vibration mode as an eighth embodiment of the invention. In FIG. 31, plural vibrators are formed with respect to a bottom surface of a first cavity in a manner similar to FIG. 24, and the low-impedance resonator of FIG. 31 differs from the low-impedance resonator of the seventh embodiment shown in FIG. 24 in that an electrode 2 is formed so as to be opposed to the whole area of a width direction of the vibrator rather than about a half area of the width direction of the vibrator. Then, it is characterized by being constructed so that electrical characteristics of a part of the vibrators opposed to this electrode 2 differ from those of the other parts and electrostatic force in a part of the electrode 2 substantially becomes larger than that in the other parts. In order to change the electrical characteristics herein, it is characterized by being constructed so that an impurity diffusion region 1d is formed in only a part of the region opposed to the electrode 2 among the vibrators and large electrostatic force is generated in a region in which this impurity diffusion region 1d is opposed to the electrode 2. Therefore, patterning of the electrode 2 as shown in FIG. 24 is not required. Also, the portion of the thickness Z0 for supporting the electrode 2 is not required in FIG. 30, so that the vibrators tend to be integrated at a higher density.

Figure 32A:
FIGS. 32A to 32E are cross sectional views showing another modified example of the resonator in the seventh embodiment of the invention.
Figure 32B:
Figure 32C:
Figure 32D:
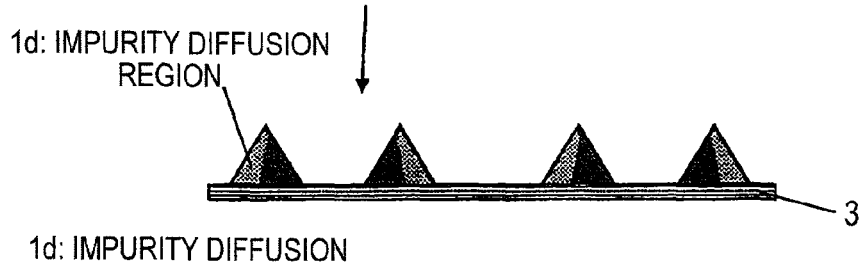
Figure 32E:
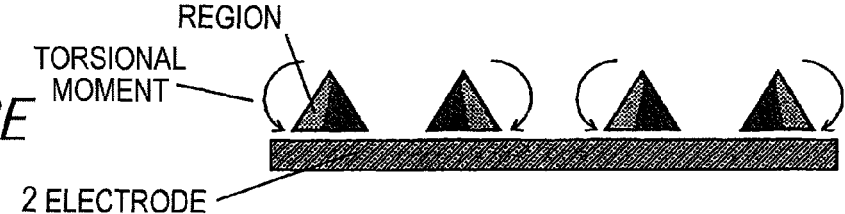
Figure 34:
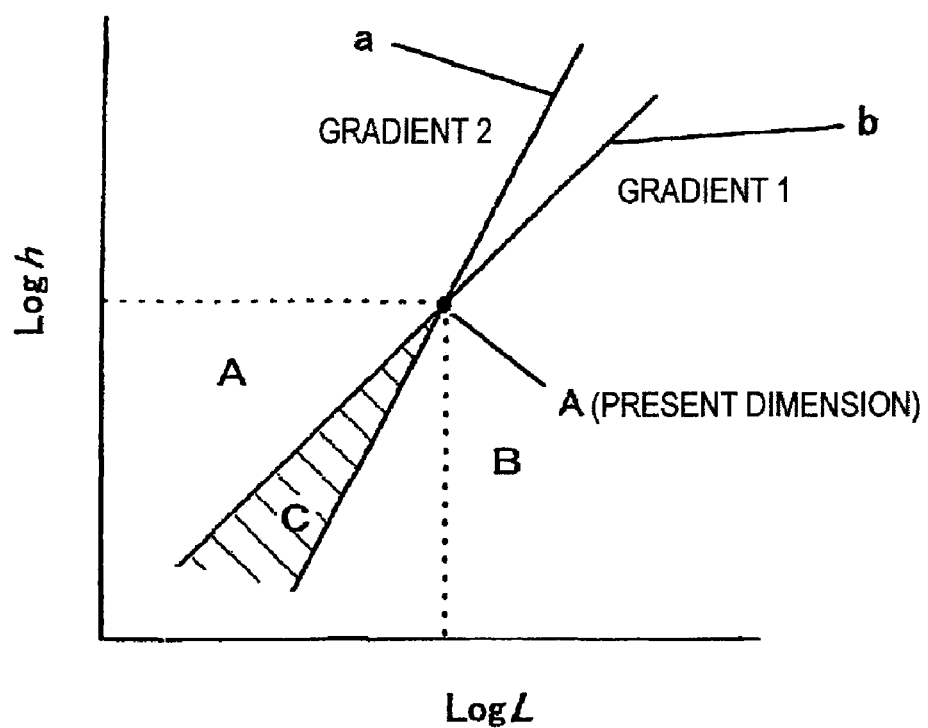
FIG. 34 is a characteristic diagram showing a relation between a higher frequency and a dimension of the mechanical resonator in a conventional example.
Figure 35:
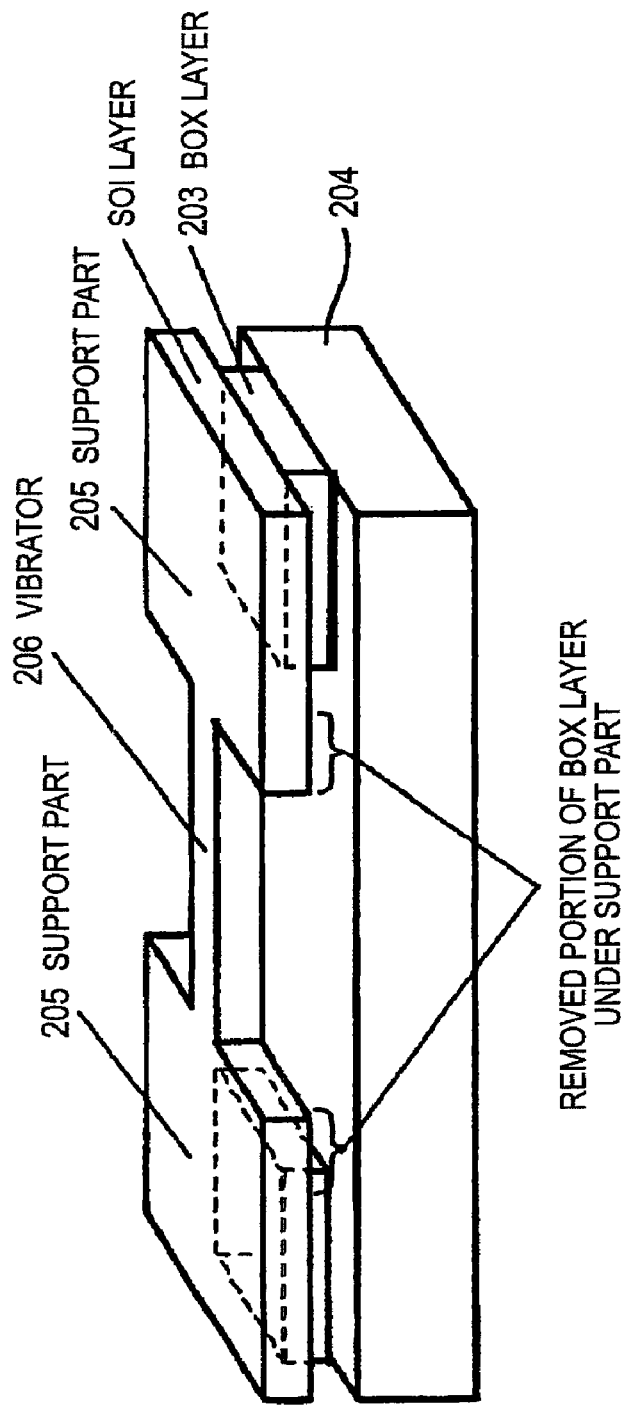
FIG. 35 is an explanatory diagram of a conventional mechanical resonator using an SOI substrate.

Conductivity of the vibrator is set in asymmetry with respect to the torsional center axis of a longitudinal direction of a beam in order to excite a torsional vibration mode in FIG. 31. FIG. 32 shows an example of a manufacturing step of giving asymmetrical properties to the conductivity. FIG. 32A is substantially similar to FIG. 14 which is the explanatory diagram of fabricating the beam with the trapezoidal cross section described in the second embodiment, but the number of patterns of a silicon nitride film mask formed on a bottom surface of a cavity is set at plural patterns. When anisotropic etching is performed on the bottom surface of the cavity, the state is shown in FIG. 32B. Here, while leaving the silicon nitride film mask, impurity ions of one conduction type such as phosphorus are implanted into a silicon surface exposed and annealing is performed and thereby, an impurity diffusion region is formed (FIG. 32C). In the case of forming the impurity diffusion region, SOG (spin on glass) or ion implantation may be used as a diffusion source. Next, when anisotropic etching is again performed after a protective film of a silicon oxide film is formed on the silicon surface into which the impurities are diffused and the silicon nitride film is removed, a beam with a triangular cross section having asymmetrical properties in conductivity is formed as shown in FIG. 32(d). Here, FIG. 32(d) is an enlarged view. When an electrode 2 is formed on a silicon oxide film 3 (lower side of the silicon oxide film in the drawing) and the silicon oxide film 3 is removed by hydrofluoric acid, a structure of FIG. 32(e), that is, the low-impedance resonator using the torsional vibration mode shown in FIG. 31 is obtained. When a voltage is applied between the vibrators and the electrode, as shown in FIG. 32(e) by asymmetrical properties of conductivities of the vibrators, the voltage is applied between the electrode and a site with high conductivity, that is, the impurity diffusion region and electrostatic force is generated and thereby, rotary excitation force (moment) is selectively applied to this impurity diffusion region and the torsional vibration mode can be excited.

By the above, in the configuration of FIG. 31, the lengths of the beams are the same, so that the plural vibrators without a resonance frequency drift can densely be placed in parallel inside the same cavity and a low impedance can be achieved and a high-Q resonator using a torsional vibration mode with a high Q value can be implemented.

In addition, the embodiment described above is constructed so as to partially change conductivity of a vibrator by diffusing impurities of one conduction type such as phosphorus, but torsional vibration can also be generated by insulating a part of the vibrator by implantation of oxygen ions etc. In this case, an implanted region of the oxygen ions is insulated and becomes a region in which electrostatic force is resistant to being generated and thereby, rotary excitation force (moment) is applied to a region in which the oxygen ions are not implanted, and the torsional vibration mode can be excited.

INDUSTRIAL APPLICABILITY

A resonator according to the invention is constructed so that an extremely fine structural body capable of being fabricated in a semiconductor process is excited by electrostatic force mainly, and particularly with respect to a beam type vibrator, a support part is formed in a robust structure and a surface of the vibrator is formed in a flat crystal plane and thereby, a resonator with a high Q value in which dissipation of vibration energy is reduced is provided. The present resonator is useful as a high-frequency circuit etc. integrated at a high density and loaded into a portable wireless terminal. Also, it can be applied to uses of medical or environmental fields etc. of a mass analysis etc. by mechanical resonance or a spectral analysis in an ultrasonic band or a voice band.

The invention claimed is:
1. A vibrator unit, comprising:
  a cavity formed in a back surface of a single-crystal substrate; and
  a vibrator formed so that at least one end of the vibrator is supported by a support part of the single-crystal substrate within a space between a front surface of the single-crystal substrate and a bottom surface of the cavity,
  wherein the single-crystal substrate is a silicon substrate;
  wherein the vibrator is a beam type vibrator having a cross section shape that is a triangular shape or a trapezoidal shape surrounded by crystal planes of {100} and {111}; and
  wherein a thickness of the vibrator is thinner than that of the support part and the support part is axisymmetrical with respect to a length direction of a beam of the vibrator.
2. A resonator comprising:
  a single-crystal substrate;
  a cavity formed in a back surface of the single-crystal substrate;

a beam type vibrator formed so that at least one end of the vibrator is supported by a support part of the single-crystal substrate within a space between a front surface of the single-crystal substrate and a bottom surface of the cavity; and an electrode which applies excitation force of electrostatic force to the beam type vibrator, wherein the single-crystal substrate is a silicon substrate;

wherein a cross section shape of the beam type vibrator is a triangular shape or a trapezoidal shape surrounded by crystal planes of {100} and {111}; and wherein a thickness of the vibrator is thinner than that of the support part, and the support part is axisymmetrical with respect to a length direction of a beam of the vibrator.

3. The resonator according to claim 2, wherein a plurality of the beam type vibrators are formed within the space between the front surface of the single-crystal substrate and the bottom surface of the cavity.

4. The resonator according to claim 2, wherein the single-crystal substrate is an SOI layer of an SOI substrate.

5. The resonator according to claim 2, wherein the electrode is opposed to the whole area of a width direction of a side surface of the beam type vibrator exposed to a front surface of the single-crystal substrate through an air gap; and wherein a capacity is formed between the beam type vibrator and the electrode.

6. The resonator according to claim 5, wherein conductivity of the vibrator is asymmetrical with respect to a torsional center axis of the longitudinal direction of the beam of the vibrator.

7. The resonator according to claim 2, wherein the electrode is opposed to substantially a half area of a width direction of a side surface of the beam type vibrator exposed to a front surface of the single-crystal substrate through an air gap; and wherein a capacity is formed between the beam type vibrator and the electrode.

8. The resonator according to claim 2, wherein a plurality of electrodes are arranged in response to a resonance mode order of the beam type vibrator; and wherein each of the plurality of electrodes applies excitation force of electrostatic force to the beam type vibrator.

9. The resonator according to claim 2, wherein the electrode is fixed on a thick film part of the single-crystal substrate arranged at a peripheral edge of the cavity through an insulating film.

10. The resonator according to claim 2, wherein the beam type vibrator is a straddle mounted beam and both ends of its beam are equipped with support parts made of impurity diffusion regions of a conduction type opposite to that of the beam type vibrator, and wherein the beam type vibrator is used as a channel of an amplifier and the support parts made of the impurity diffusion regions are used as a source region and a drain region of the amplifier.

11. The resonator according to claim 2, comprising a plurality of resonators electrically arranged in parallel.

12. The resonator according to claim 2, wherein the vibrator is accommodated inside a case in which the atmosphere is sealed in a vacuum.

13. An electromechanical filter constructed so as to pass or block a signal of a desired frequency band by using the resonator according to claim 2.

* * * * *